United States Patent [19]

Shima et al.

[11] Patent Number: 4,494,139
[45] Date of Patent: Jan. 15, 1985

[54] AUTOMATIC ASSEMBLY SYSTEM

[75] Inventors: Yoshihiro Shima, Kodaira; Seiji Kashioka, Hachioji; Takeshi Uno, Sayama; Kunio Suzuki, Chigasaki, all of Japan

[73] Assignee: Hitachi, Ltd., Tokyo, Japan

[21] Appl. No.: 363,456

[22] Filed: Mar. 30, 1982

[30] Foreign Application Priority Data

Apr. 3, 1981 [JP] Japan ................................ 56-49313

[51] Int. Cl.³ .............................................. H04N 7/18
[52] U.S. Cl. ..................................... 358/101; 358/107
[58] Field of Search ......................... 358/101, 107, 93; 364/491, 559; 382/8; 29/740, 759, 834

[56] References Cited

U.S. PATENT DOCUMENTS

4,203,132 5/1980 Schmitt et al. ...................... 364/559
4,342,090 7/1982 Caccoma et al. .................... 364/491

OTHER PUBLICATIONS

R. F. Duffy et al., "Automatic CCTV Positioning System", IBM Technical Disclosure Bulletin, vol. 14, No. 8, Jan. 1972.

Primary Examiner—Michael A. Masinick
Assistant Examiner—Edward L. Coles
Attorney, Agent, or Firm—Antonelli, Terry & Wands

[57] ABSTRACT

An automatic assembly system wherein parts supplied from a feeder are held by a holder and are automatically mounted onto predetermined positions of a circuit board; comprising a first image pickup device which images at least a portion of said circuit board, a second image pickup device which images at least a portion of the part held by the holder means, a signal processor which processes an output of said first image pickup device to detect a deviation of said circuit board from a reference position and which also processes an output of said second image pickup device to detect a magnitude of deviation between said part and the predetermined position of said circuit board, and a positioning device which operates under control of said signal processor so as to adjust said predetermined position of said circuit board to a position opposing to said part and also to move said part toward said circuit board.

34 Claims, 29 Drawing Figures

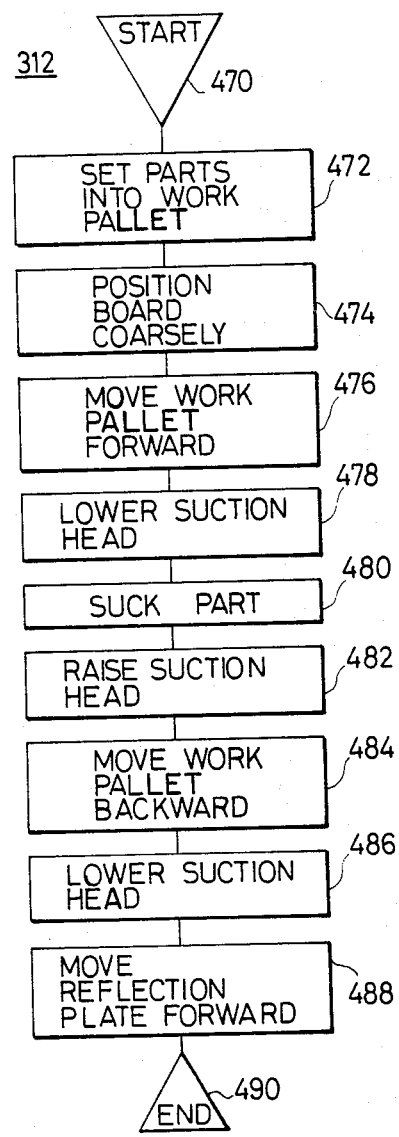
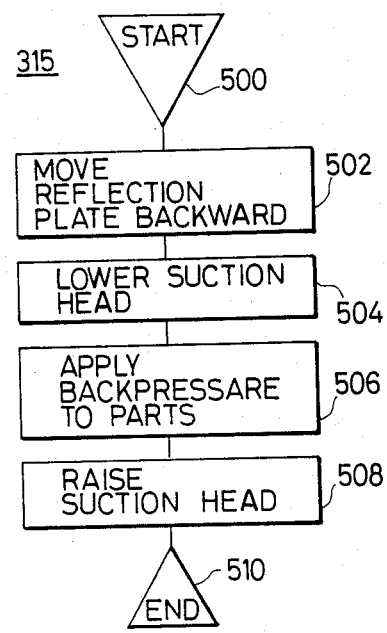
FIG. 17
FIG. 18

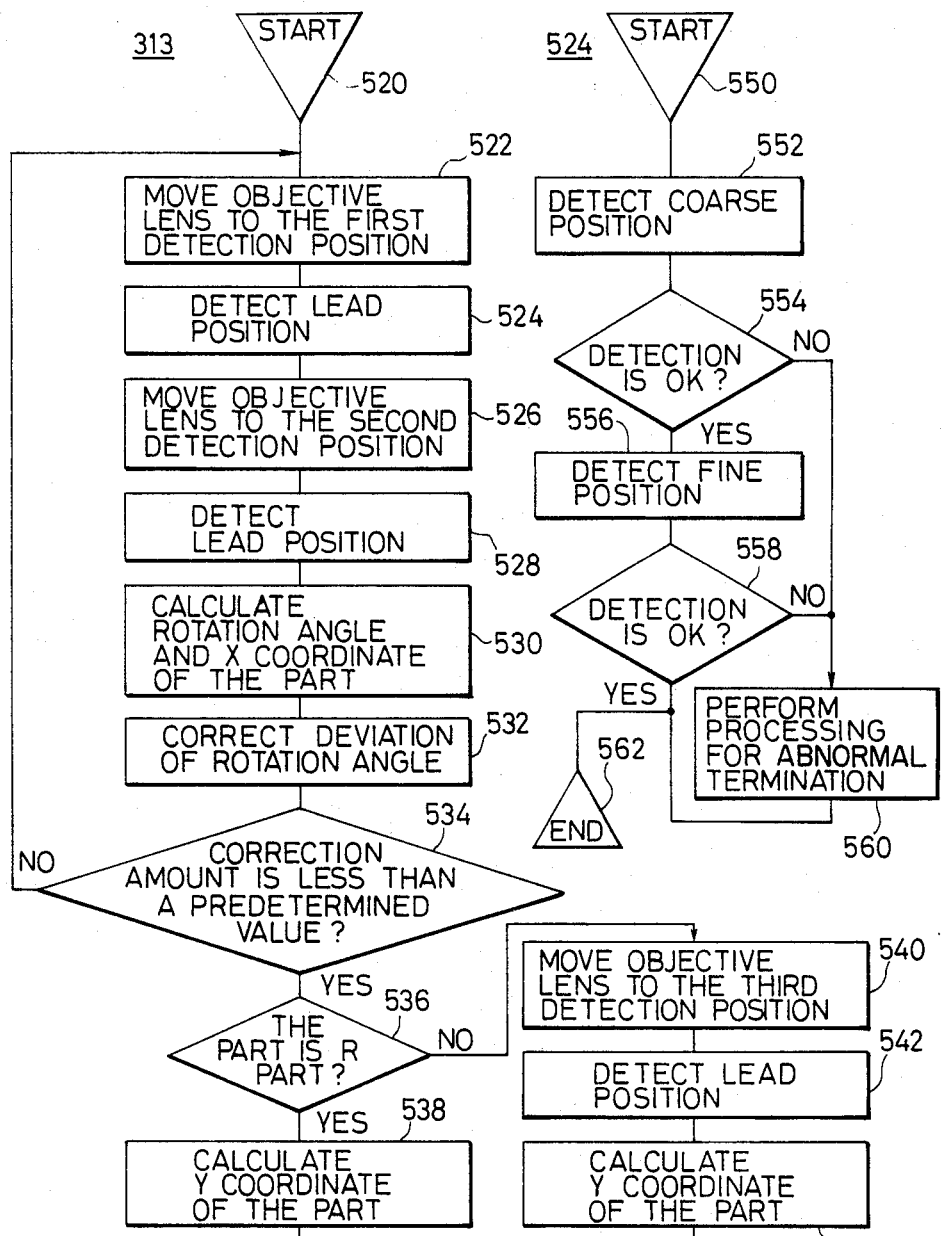

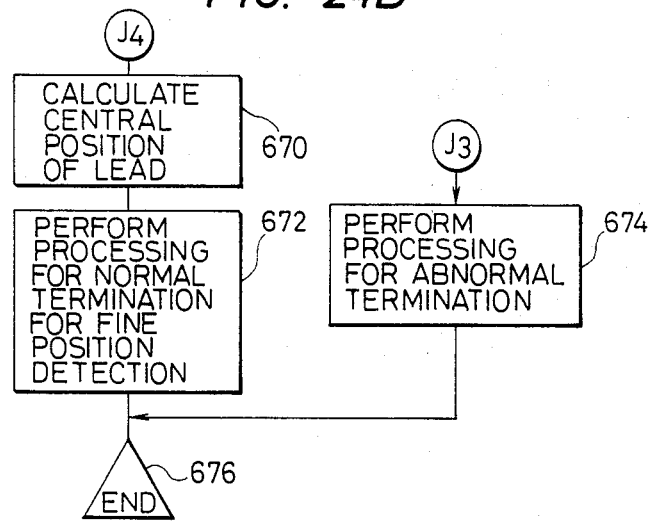
FIG. 24B
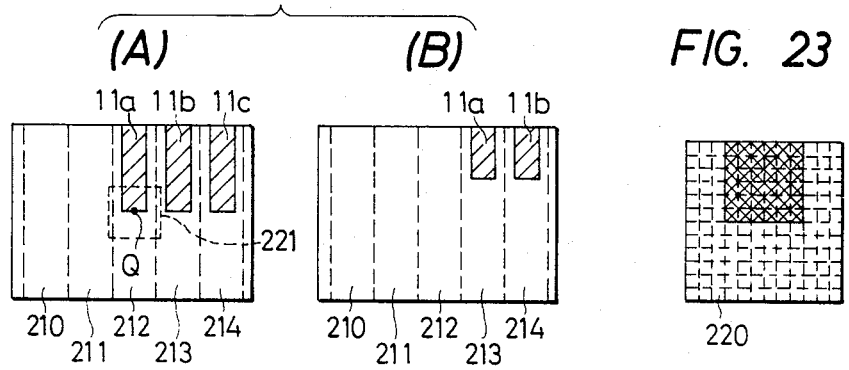
FIG. 22
FIG. 23
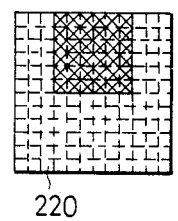
FIG. 25
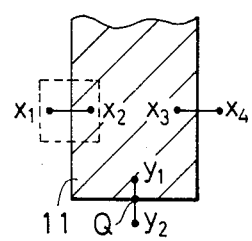
FIG. 26
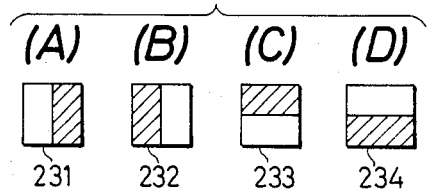

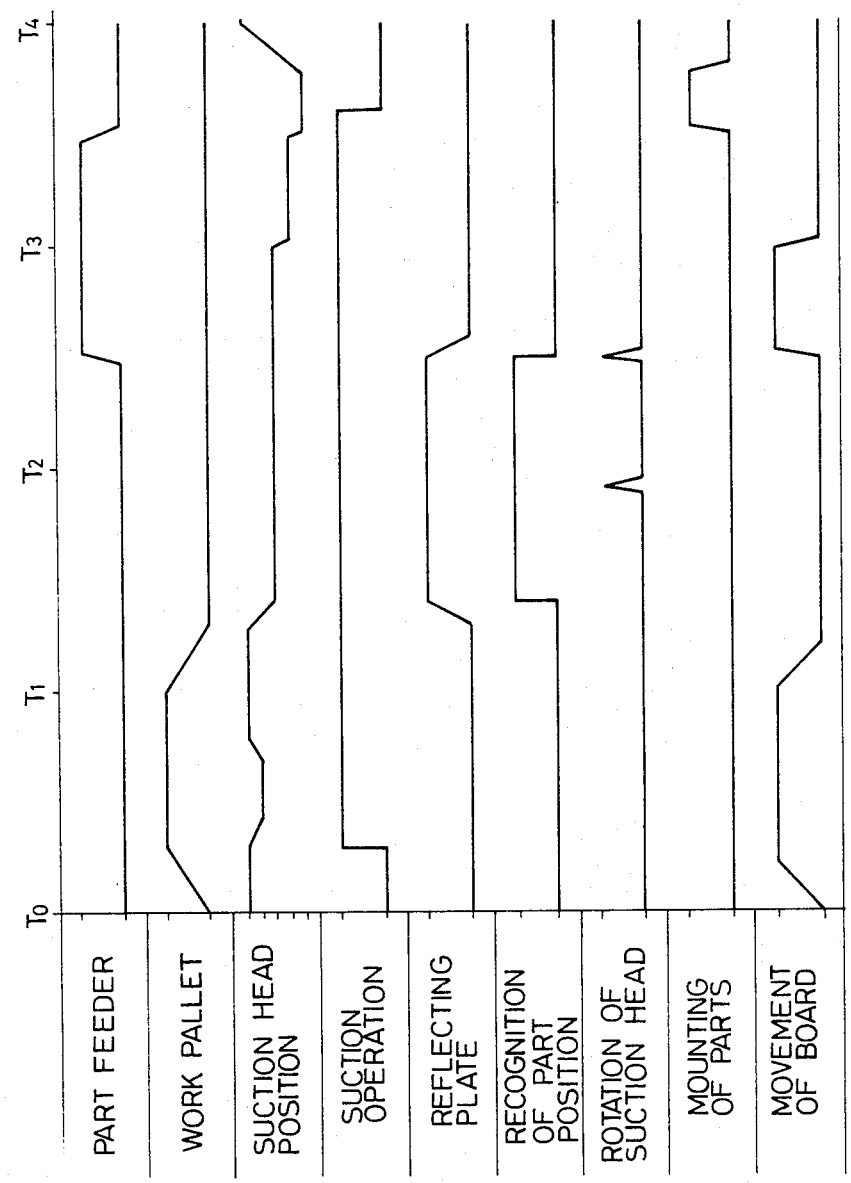

AUTOMATIC ASSEMBLY SYSTEM

BACKGROUND OF THE INVENTION

The present invention relates to an automatic assembly system, and more particularly to an automatic assembly system which automatically mounts parts onto predetermined positions of a printed circuit board at high positional accuracy.

In an automatic assembly system which mounts parts onto predetermined positions of a circuit board in predetermined locations, if the supply error of the part to a part holder for transporting the part to the mounting position is sufficiently smaller than the allowable error range of the mounting position, the purpose can be achieved by the simple control operation of moving the holder to a target position in accordance with a predetermined numerical value after the part has been supplied. However, in the case of assembly operations in which electronic parts, e.g., ICs and LSIs, having large numbers of fine leads at very small intervals are precisely mounted onto minute wiring terminals on a printed circuit board as formed in correspondence with the leads, the extent of a positional deviation allowed between each lead and the corresponding wiring terminal is very small, and hence, it is extremely difficult that the supply error of the part from a feeder to the holder be maintained within a range permitting the aforementioned simple control. Especially in the case of mounting onto the printed circuit board the LSI whose package has a plurality of leads on its each edge, the allowable range of the lengthwise positional deviation of the lead is restricted by the width of the lead extending in the direction orthogonal thereto, and hence, the extent of dispersion allowed for the supply of the part to the holder is very severe. When it is intended to realize the allowable supply, the parts feeder and the holder become complicated and expensive. Moreover, according to such system, the application to the automatic assembly of a plurality of sorts of parts having different dimensions and shapes is difficult.

SUMMARY OF THE INVENTION

It is accordingly an object of the present invention to provide an automatic assembly system which can mount parts onto predetermined positions of a circuit board at high positional accuracy.

Another object of the present invention is to provide an automatic assembly system which makes it possible to mount onto a circuit board a plurality of types of parts supplied in succession.

Still another object of the present invention is to provide an automatic assembly system which can mount parts onto a circuit board at high speed.

In order to accomplish these objects, according to the present invention, an automatic assembly system wherein parts supplied from a feeder are held by a holder and are automatically mounted onto predetermined positions of a circuit board comprises a first image pickup device which images at least a portion of said circuit board, a second image pickup device which images at least a portion of the part held by the holder means, a signal processor which processes an output of said first image pickup device to detect a deviation of said circuit board from a reference position and which also processes an output of said second image pickup device to detect the magnitude of deviation between said part and the predetermined position of said circuit board, and a positioning device which operates under control of said signal processor so as to adjust said predetermined position of said circuit board to a position opposing said part and also to move said part toward said circuit board.

BRIEF DESCRIPTION OF THE DRAWINGS

FIG. 16A is a program flow chart showing the details of a routine (302) for correcting the position of the printed circuit board in FIG. 13, while FIG. 17 is a program flow chart showing the details of a part supplying routine (312) in FIG. 13, FIG. 18 is a program flow chart showing the details of a part mounting routine (315) in FIG. 13, FIG. 19 is a program flow chart showing the details of a routine (313) in FIG. 13, FIG. 20 is a program flow chart showing the details of a lead position detecting routine (524 (528 or 542)) in FIG. 19, FIG. 22 is a diagram showing different patterns of leads included in the imaging field of view, FIG. 23 is a diagram showing an example of a standard pattern which is applied to the coarse position detection, FIGS. 24A and B is a program flow chart showing a more detailed procedure of a routine (556) for detecting the fine position of a lead in FIG. 20, FIG. 25 is a diagram for explaining pattern search areas which are set for the fine position detection, FIG. 26 is a diagram showing examples of standard patterns which are applied to the fine position detection, and FIG. 27 is an operating time chart of the principal elements within an interval in which one electronic part is processed by the automatic mounting system in FIG. 1.

DETAILED DESCRIPTION OF THE PREFERRED EMBODIMENT

According to one embodiment of the present invention, a first image pickup device has a fixed field of view and receives the images of a plurality of places on a circuit board by moving the circuit board by means of a positioning device, while a second image pickup has a movable field of view and receives the images of a plurality of places of a part held by holder means, with the holder kept fixed. A signal processor processes the plurality of input images from the first and second image pickup devices so as to detect the respective positional deviations of the circuit board and the part.

The positioning device consists of first positioning means capable of moving the circuit board in the directions of X- and Y-axes and a rotational direction round a Z-axis intersecting orthogonally to the X- and Y-axes, and second positioning means capable of moving a parts feeder in the direction of the Z-axis and the rotational direction round the Z-axis. The signal processor controls the positioning of the first positioning means in the rotational direction round the Z-axis in response to the processed result of the output signal of the first image pickup device, and makes the positioning controls of the second positioning means in the rotational direction round the Z-axis and the first positioning means in the directions of the X- and Y-axes in response to the processed result of the output signal of the second image pickup device.

Hereunder, an embodiment of the present invention will be described in detail with reference to the drawings. This embodiment illustrates an example of application of the present invention to an automatic assembly system which successively mounts a plurality of electronic parts of mutually different sizes onto predetermined positions of a printed circuit board.

Figure 1:
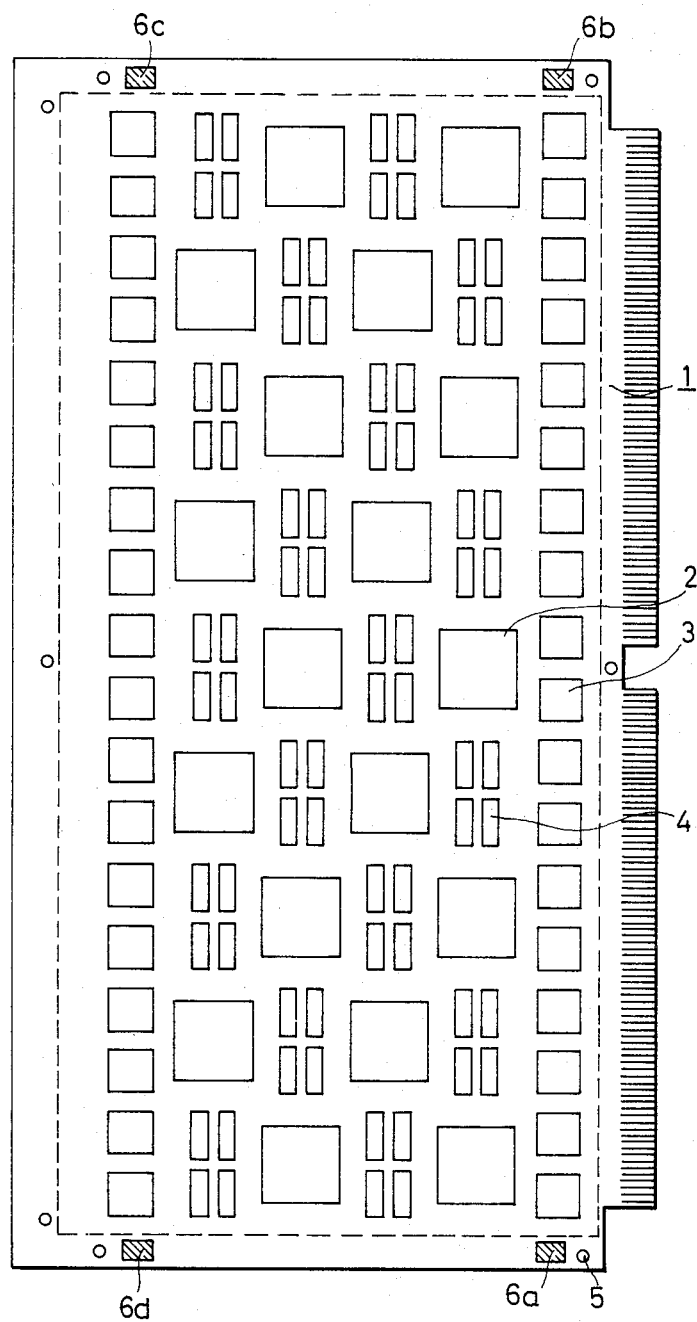
FIG. 1 is a view showing an example of a printed circuit board (1) on which electronic parts are mounted.

FIG. 1 is a view showing the schematic construction of a printed circuit board 1 on which electronic parts are to be mounted. An area enclosed with a broken line is an area for forming microscopic wiring patterns. In the wiring area, groups of wiring side terminals to be connected with the respective lead terminals of the electronic parts are formed in conformity with the arrays of the lead terminals. Rectangles indicated by numerals 2, 3 and 4 in FIG. 1 are the areas in which the groups of the connecting terminals with a large-sized IC (hereinbelow, termed "LSI part"), a small-sized IC (hereinbelow, termed "SSI part") and a resistance element (hereinbelow, termed "R part") are formed, respectively. In this example, 18 LSI parts, 36 SSI parts and 72 R parts are mounted on the printed circuit board 1. Numeral 5 indicates each hole for passing a pin which serves to fix the printed circuit board 1 on the printed circuit board-moving table of the automatic assembly system to be described later. Hatched parts 6a–6d at the four corners of the printed circuit board are areas for forming cross marks which afford the reference positions of the printed circuit board in the case of correcting the positional deviation of the printed circuit board carried on the aforementioned moving table. The positions of the four cross marks and the respective mounting positions of the foregoing three sorts of electronic parts are stored beforehand in a data processor which controls the operation sequence of the assembly system. The respective parts mentioned above can be moved to predetermined positions by numerically controlling the circuit board-moving table with the data processor.

Figure 2:
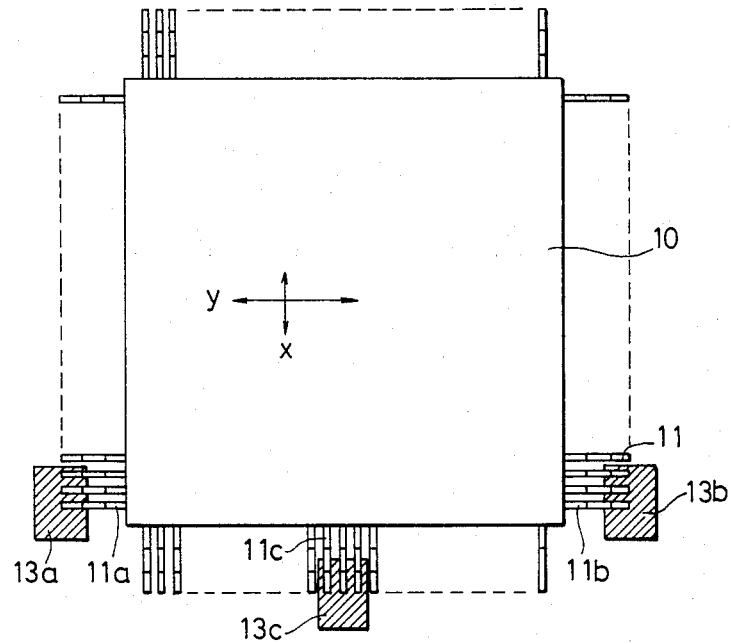
FIGS. 2, 3 and 4 are plan views of different electronic parts which are mounted on the printed circuit board, respectively.
Figure 3:
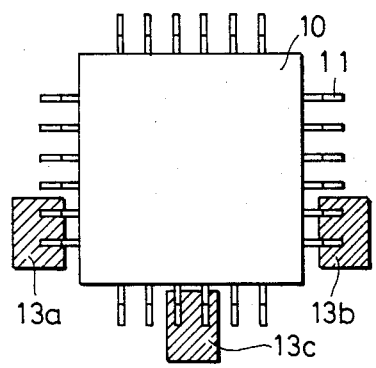
Figure 4:
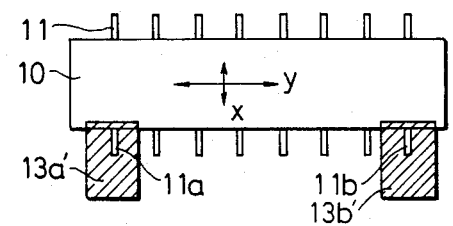

FIGS. 2, 3 and 4 show the shapes of the LSI part, the SSI part and the R part, respectively. The LSI part or SSI part for use in this embodiment has a plurality of leads 11 along each edge of a package 10 containing an integrated circuit therein, while the R part has a plurality of leads 11 along each of two edges of a package 10. By way of example, the LSI part has package dimensions of 21.6×21.6 mm square, and its leads each being 0.3 mm wide lie at intervals of 0.762 mm. The SSI part has the package of 10.4 mm square with the leads each of which is 0.43 mm wide and which are arrayed at intervals of 1.27 mm, while the R part has the package of 17.5×4.1 mm square with the leads each of which is 0.3 mm wide and which are arrayed at intervals of 1.90 mm. As will be described later, these electronic parts are held by a vacuum suction head, and they are attached to the predetermined positions on the printed circuit board after their positional deviations have been corrected by a pattern recognition processing utilizing an image pickup device.

Figure 5:
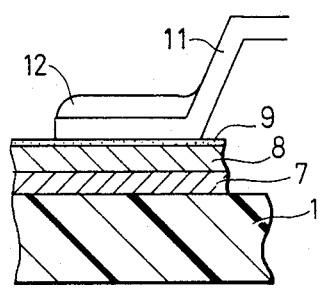
FIG. 5 is a view showing the state of connection between a terminal on the printed circuit board and the end portion of the lead of the electronic part.

FIG. 5 shows the state of the fore end part of the lead of the electronic part mounted on the printed circuit board. Numeral 7 designates a wiring layer formed on the surface of the printed circuit board, numeral 8 a solder layer, numeral 9 a paste applied on the surface of the solder layer, and numeral 12 an opposing solder layer piled on the upside of the fore end part of the lead 11. Each part positioned on the printed circuit board is temporarily bonded onto the solder layer 8 of the printed circuit board side terminal through the paste 9 by depression from above the package as based on the descent of the suction head. The printed circuit board on which all the parts have been mounted is taken off from the assembly system, and is put into a heating furnace so as to be heat-treated at the fusing point of the solder layers 8 and 12.

Figure 6:
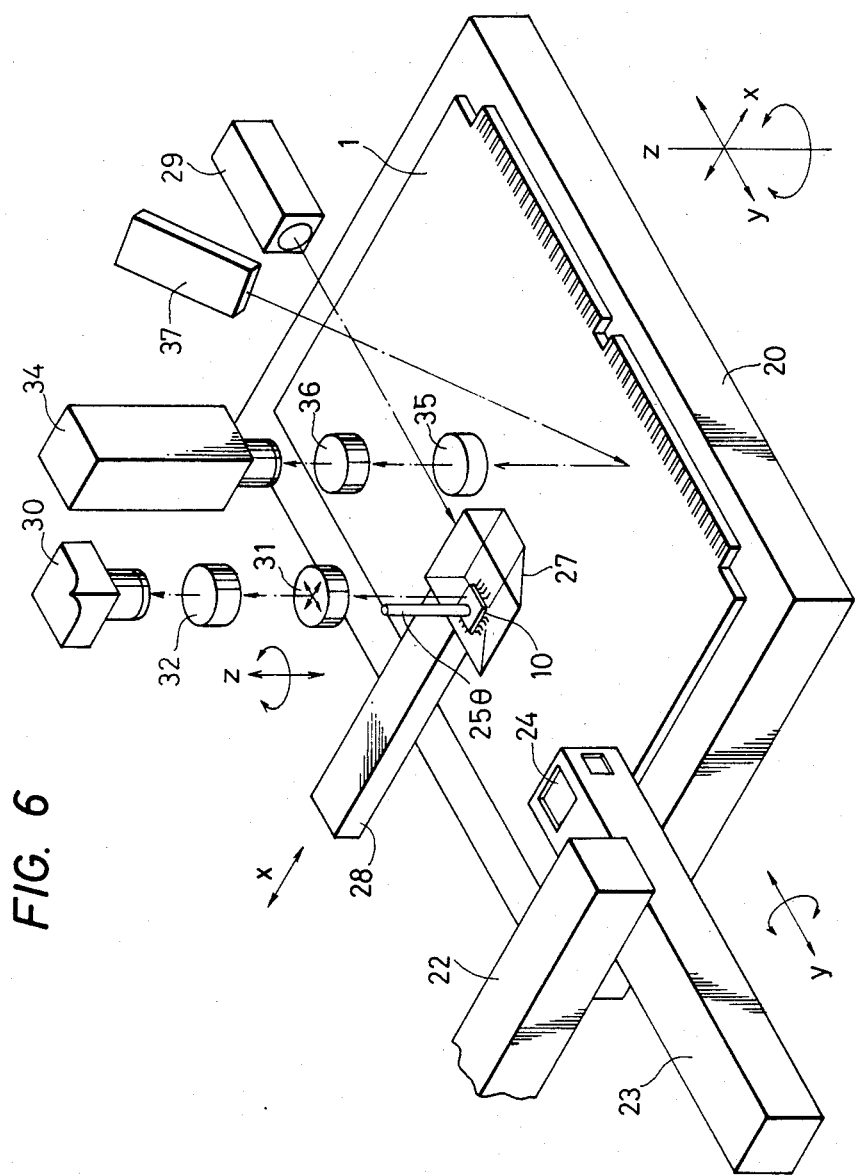
FIG. 6 is a perspective view schematically showing the mechanism portions of a system which automatically mounts the electronic parts onto the printed circuit board.

FIG. 6 shows the construction of mechanical parts in the assembly system according to the present invention for automatically executing the above operations of assembling the printed circuit board and the electronic parts. Referring to the figure, numeral 20 designates the circuit board-moving table which moves the printed circuit board 1 in the directions of x- and y-axes and also rotates it round a z-axis, numeral 22 designates a parts feeder which supplies the plurality of kinds of electronic parts in succession in a predetermined number for each kind, and numeral 23 designates a work pallet which can reciprocate in the y-axial direction and which receives in its front end portion 24 the part supplied from the feeder 22 and transports it to a position directly under the vacuum suction head 25θ. The illustrated work pallet can handle the different kinds of electronic parts by rotating round the y-axis. The vacuum suction head 25θ is driven by a positioning device, not shown, which permits it to move along the z-axis and to rotate round the z-axis. It operates so as to correct the rotational deviation round the z-axis, of the part received from the work pallet 23 and to thereafter lower and mount the part onto the surface of the printed circuit board 1. Numeral 27 identifies a reflector plate which is attached to the fore end of an x-axial moving device 28. As is apparent from FIG. 6, the reflector plate 27 prevents the imaging of the area of the printed circuit board 1 directly below the reflector. After the work pallet 23 has ended the delivery of the part to the suction head 25θ and withdrawn to the position of the parts feeder 22, the reflector plate is inserted between the suction head 25 and the printed circuit board 1 and upwardly reflects light from a projector 29 entering sideways, so as to illuminate the electronic part 10 from below. Shown at numeral 30 is a television camera which serves to detect the position of the electronic part 10 held by the suction head 25, and which overlies the suction head 25 so that the image of the leads of the electronic part can be received as an input through an objective lens 31 as well as an eyepiece 32. As illustrated in FIG. 5, the opposing solder 12 is piled on the upside of the fore end part of the lead 11 of the electronic part. Therefore, when the electronic part is illuminated from above, illuminating light is curvedly reflected by the solder surface and the correct external shape of the lead cannot be imaged. In contrast, when the electronic part 10 is illuminated from below by the reflector plate 27 as in FIG. 6, the correct silhouette of the external shape of the lead can be imaged. When the input image of the television camera 30 has been processed and the position of the electronic part 10 has been detected, the reflector plate 27 is withdrawn to its original position. The positional deviation of the electronic part 10 in the rotational direction is corrected by the rotating drive of the suction head 25θ, while the positional deviations thereof in the x and y directions are corrected by the drive of the printed circuit board-moving table 20. Thereafter, the suction head 25θ is lowered along the z-axis to mount the electronic part onto the predetermined position on the printed circuit board. In addition, when the mounting of one part has been completed, the circuit board-moving table 20 is driven so that the mounting position of the next part may come directly under the suction head 25θ. Numeral 34 indicates a television camera which serves to detect the position of the printed circuit board, and which picks up the image of the printed circuit board surface illuminated by a projector 37, through an objective lens 35 as well as an eyepiece 36. The positions of the foregoing cross marks 6a–6d on the printed circuit board are detected by this television camera 34, the field of view of which is moved by the circuit board-moving table 20.

As already stated, the automatic assembly system is directed to the electronic parts having the very minute leads and is required to precisely position these leads to the wiring terminals on the printed circuit board. To this end, an image expanded by the lens system is applied as an input to the television camera. In this case, when the image of the whole electronic part is picked up, the resolution degrades in relation to the sampling interval of an image signal for the pattern recognition, and a high positional detection accuracy required for the positioning of the leads cannot be attained.

In the system of the present invention, therefore, the position of the electronic part is detected in such a way that the image of the lead portion of the electronic part is enlarged and picked up and that the imaging fields of view in a plurality of places are used for performing the pattern recognition processing. Areas 13a, 13b and 13c and areas 13a' and 13b' indicated by hatching in FIGS. 2–4 are the pattern recognition processing areas for detecting the positional deviations of the parts held by the suction head. In the case of the present embodiment, regarding the LSI part and the SSI part each of which has the leads on the four edges of the package, the leads are detected in the three imaging areas 13a, 13b and 13c. The imaging areas 13a and 13b are set at positions which include the endmost leads 11a and 11b of the leads arrayed on the two edges in the x-axial direction, while the other imaging area 13c is set at the middle part of the y-axial edge closer to the aforementioned leads 11a and 11b. The positional deviations of the electronic part in the x-axial direction and the rotational direction are obtained from the positions of the leads 11a and 11b detected in the imaging areas 13a and 13b, while the positional deviation of the electronic part in the y-axial direction is obtained from the Y coordinate of the lead 11c detected in the imaging area 13c. On the other hand, regarding the R part which has the leads on only the two edges in the y-axial direction, a comparatively large positioning error can be allowed in the x-axial direction. Therefore, the imaging areas 13a' and 13b' are set at both the end parts of one edge as in FIG. 4, and the positional deviations in the x- and y-axial and rotational directions are obtained from the positional coordinates of the endmost leads 11a and 11b detected in the respective areas.

In changing the imaging field of view, either the suction head 25⊖ or the television camera 30 including the optical system may well be removed within the xy-plane. The automatic assembly system of FIG. 6, however, adopts a method in which only the objective 31 is moved in the x-axial and y-axial directions with the positions of the suction head and the television camera fixed.

Figure 7:
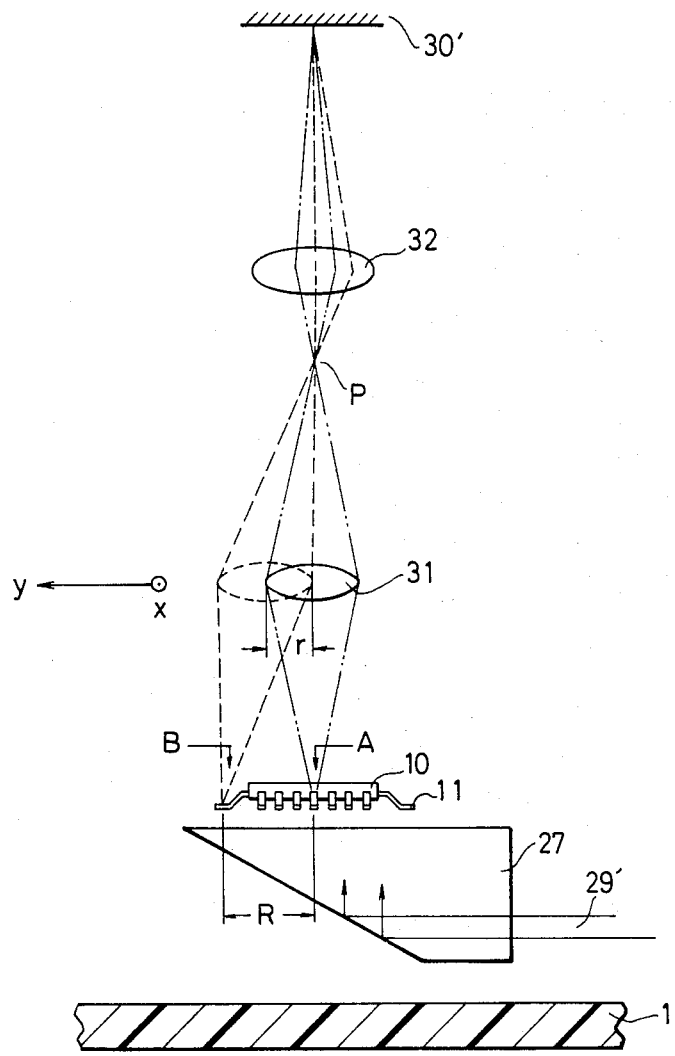
FIG. 7 is a view for explaining the optical system of a first image pickup device in the automatic mountng system.

FIG. 7 shows the positional relationship among the electronic part 10, the objective lens 31, the eyepiece 32 and the imaging plane 30' of the television camera 30. The illumination light 29' from the projector 29 is reflected by the reflector plate 27, and illuminates the electronic part 10 from below. When the objective 31 lies in a position indicated by a solid line, the real image of the lead within an imaging area A is focused on a point P in the actual size, and it is enlarged predetermined diameters and then focused on the imaging plane 30' by the eyepiece 32. When the objective lens 31 comes to a position of a dotted line, the enlarged image of the lead in an area B is picked up. With the method in which the imaging field of view is changed by the movement of the objective lens 31 in this manner, the moving distance of the objective may be $r = \frac{1}{2}R$ for the movement of the field of view over a distance R. Accordingly, in comparison with the method in which the television camera 30 or the suction head 25⊖ is moved, the above method can shorten the period of time required for changing the imaging field of view and can prevent the degradation of the positional accuracy attendant upon the movement of the field of view.

Figure 8:
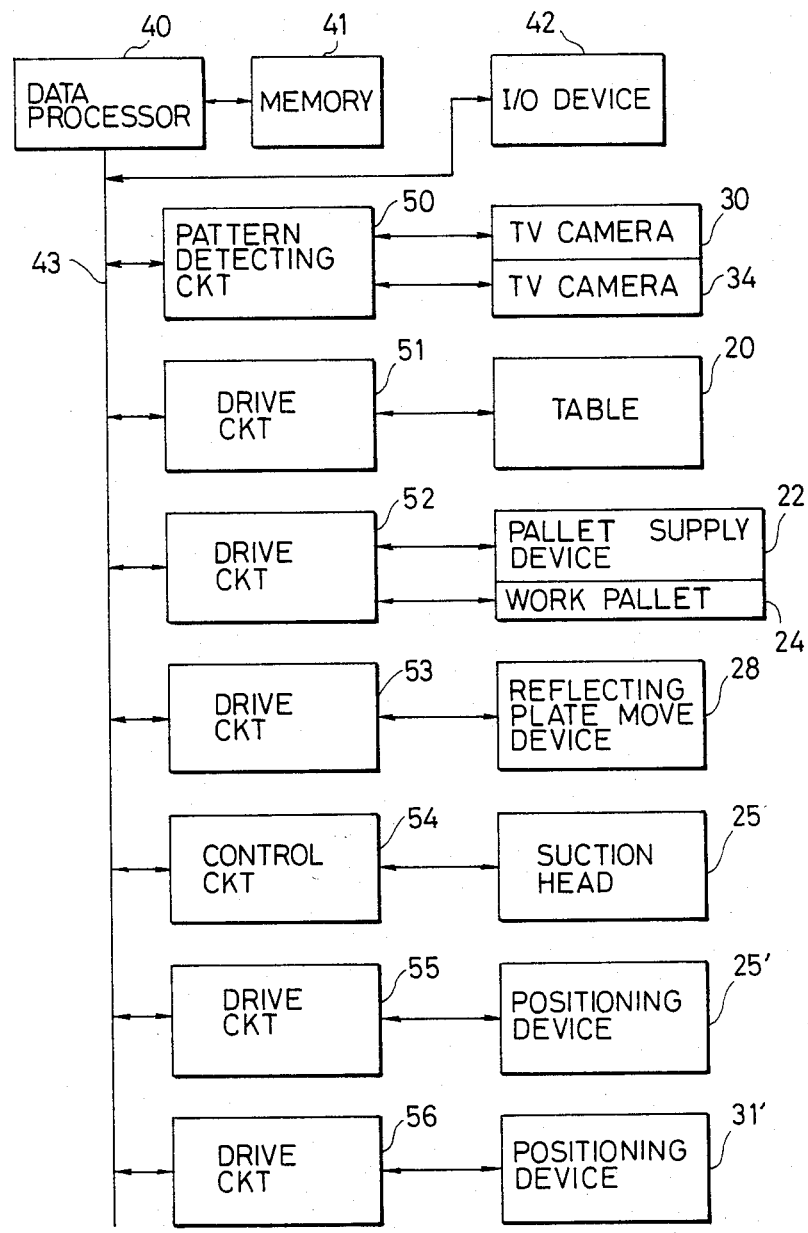
FIG. 8 is a block diagram showing the whole arrangement of a control system in the automatic mounting system.

FIG. 8 is a diagram of the control circuitry of the automatic assembly system. Numeral 40 designates the data processor which executes the operating sequence control of the whole system and various arithmetic operations for the positioning of the electronic part in accordance with a program, numeral 41 a memory device which is connected to the data processor, and numeral 42 an input/output device which is operated by an operator and which is connected to the data processor through an information bus 43. Shown at numeral 50 is a pattern detecting circuit, which selects either of the two television cameras 30 and 34 in accordance with an instruction from the data processor 40 and which executes a pattern matching between a standard pattern given from the data processor 40 and an input image from the selected television camera. The results of the pattern matching for one picture are stored in a memory contained in the pattern detecting circuit 50, and the contents of this memory are loaded into the data processor and are used for calculations for the position detection of the electronic part. The details of the pattern detecting circuit 50 will be described later with reference to FIGS. 9-12.

Numeral 51 indicates a drive circuit for the printed circuit board-moving table 20, numeral 52 a drive circuit for the parts feeder 22 and the work pallet 23, numeral 53 a drive circuit for the reflective plate-moving device 28, numeral 54 a circuit for controlling the vacuum suction operation of the suction head 25⊖, numeral 55 a drive circuit for the positioning device 25' for moving the suction head 25⊖, and numeral 56 a drive circuit for the positioning device 31' for moving the objective lens 31 of the television camera. These circuits 51-56 are connected to the data processor 40 through the information bus 43, and drive the controlled systems in predetermined directions in accordance with instructions given from the data processor.

Figure 9:
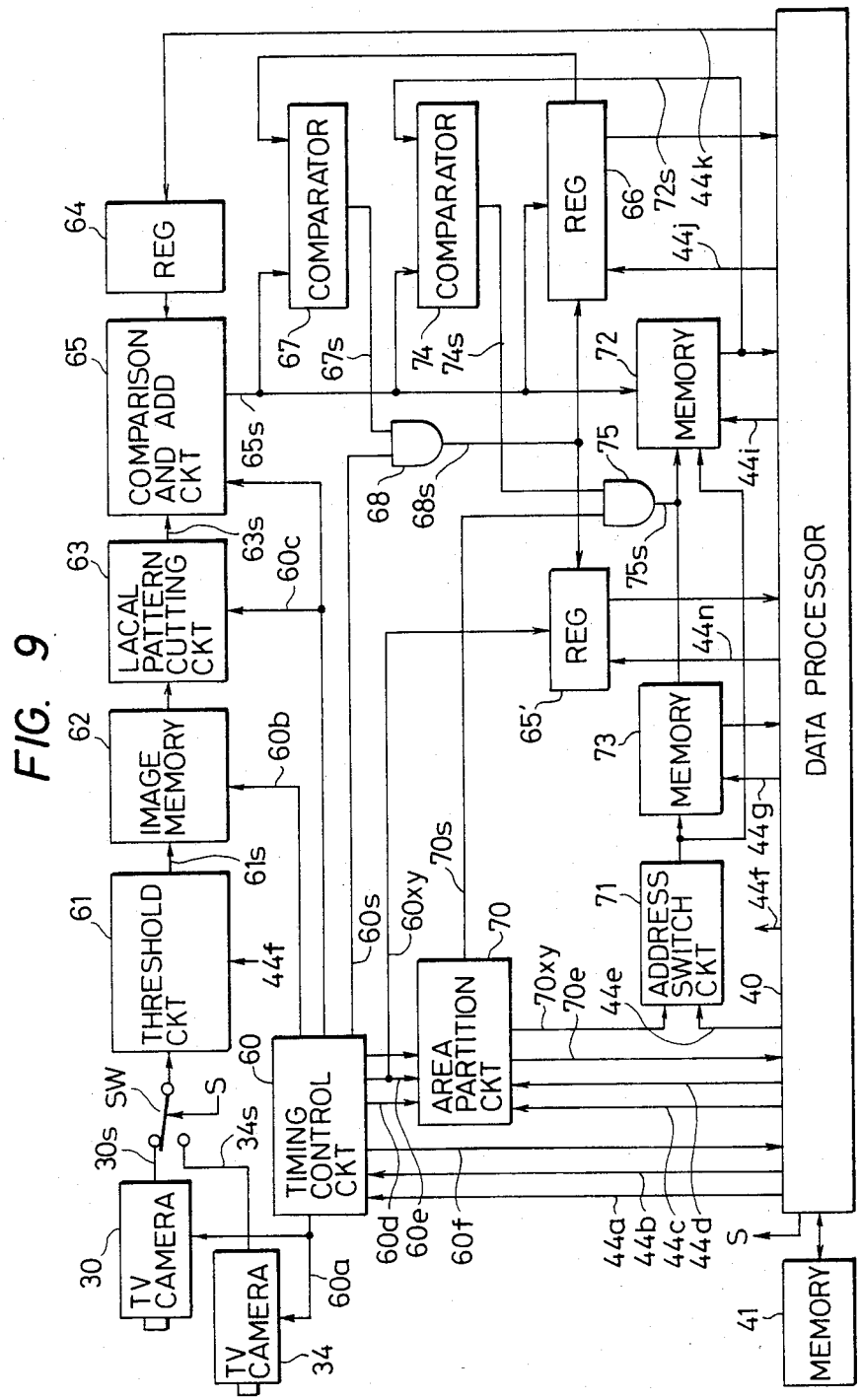
FIG. 9 is a block diagram showing an example of the concrete arrangement of a pattern detecting circuit (50) in FIG. 8.

FIG. 9 shows the pattern detecting circuit 50. This pattern detecting circuit 50 is of the type which sequentially compares the standard pattern afforded from the data processor 40 and local patterns cut out in various positions within the image applied from the television camera and which finds the coordinates of the cut-out position of the local pattern indicative of the highest degree of coincidence. In order to precisely detect the respective positions of a plurality of leads projected in the same shape within the imaging field of view, the pattern detecting circuit is operated as follows: (1) By changing the sampling interval of the image signal, the size of an image area to be cut out as the local pattern is made variable, and a coarse pattern matching and a highly precise pattern matching can be selectively carried out. (2) The search area of a pattern is set in any desired size within an image, and only the results of the pattern matching within the search area are made effective. (3) The imaging picture is partitioned into a plurality of sections, and the position coordinates of the local patterns which are the closest to the standard pattern are found in the respective sections. The sampling interval, the position and size of the search area, the sizes of the sections partitioned, etc. are all instructed from the data processor 40 in accordance with the steps of the operation sequence of the automatic assembly.

In FIG. 9, numeral 60 denotes a timing control circuit which generates a camera synchronizing signal 60a, various timing signals 60b-60f and the position coordinate signal 60xy of the picture scanning point of the television camera, and the details of which will be described later with reference to FIG. 11. The television cameras 30 and 34 raster-scan the picture in synchronism with the horizontal and vertical synchronizing signals 60a provided from the timing signal generator 60, and they deliver image signals 30s and 34s, respectively. Either of these image signals is selected by a switch SW which is changed-over by a control signal S from the data processor 40, and it is applied to a thresholding circuit 61. The thresholding circuit 61 compares the input image signal with a predetermined threshold value appointed by a control signal 44f from the data processor 40, and it converts the result of the comparison into a binary signal 61s of "1" or "0", which is supplied to an image memory 62.

The image memory 62 serves to store a two-dimensional picture. It stores the picture while successively shifting pictures corresponding to (n−1) scanning lines, and it delivers in parallel to the signals of n picture elements in the positional relationship in which they are arrayed in the vertical direction on the imaging plane. Numeral 63 indicates a local pattern cutting circuit which receives the output signals from the image memory 62 and which converts them into a two-dimensional local pattern of (n×n') bits so as to deliver the latter. The image memory 62 and the local pattern cutting circuit 63 are respectively operated by the clock signals 60b and 60c which are delivered from the timing control circuit 60. They are so arranged as to cut out the local patterns in succession in such a way that the sampling interval is changed by changing the periods of the clock signals. Their specific arrangements will be described later with reference to FIG. 10.

Numeral 64 denotes a register for holding the standard pattern which consists of the information of (n×n') picture elements and which is to be compared with the local pattern. The content of this register and the output of the local pattern cutting circuit 63 are compared every corresponding bit by a comparison and add circuit 65, and the total number of bits having coincided in content is delivered as a signal 65s indicating the degree of coincidence between the local pattern and the standard pattern. Since the circuit 65 is operated in synchronism with the cutting circuit 63, the degree-of-coincidence signals 65s are successively provided in parallel with the scanning of the imaging picture.

Symbol 65' represents a register for storing coincident coordinates, symbol 66 a degree-of-coincidence storing register, and symbol 67 a comparator which compares the content of the degree-of-coincidence storing register 66 with the degree-of-coincidence signal 65s and which provides a pulse signal 67s when the degree-of-coincidence signal 65s is greater than the value of the register 66. This pulse signal 67s is applied to an AND gate 68 which is enabled by a degree-of-coincidence comparison instruction signal 60s delivered from the timing control circuit 60. Only during the output period of the comparison instruction signal 60s, the pulse signal 67s passes through the AND gate 68 and is applied to the registers 65' and 66 as a pulse 68s permitting data renewal. When the pulse 68s has been applied, the register 65' for storing coincident coordinates stores the position coordinates 60xy delivered from the timing control circuit 60, while the register 66 stores the degree-of-coincidence signal 65s. The position coordinate signal 60xy indicates the XY coordinates of the scanning point on the imaging picture, and is in a specified relation with the position of the local pattern cut out by the circuit 63. The registers 65' and 66 accordingly store the position coordinates of the closest local pattern to the standard pattern as detected within the area specified by the degree-of-coincidence comparison instruction signal 60s, and the degree of coincidence between both the patterns.

Numeral 70 indicates an area partitioning circuit which sets a pattern search area within the imaging picture on the basis of an instruction from the data processor 40 and which partitions the search area into a plurality of sections so that when the present scanning point lies within the search area, it may generate a degree-of-coincidence comparison instruction signal 70s and the address signal 70xy (70x,y) of the section to which the scanning point belongs. The specific arrangement of the circuit 70 will be described later with reference to FIG. 12. The address signal 70xy delivered from this circuit is applied to a degree-of-coincidence memory 72 and a coordinate memory 73 through an address switching circuit 71.

The degree-of-coincidence memory 72 has storage areas corresponding to the address signals 70xy, and can store the maximum degrees of coincidence between the local patterns and the standard pattern up to the present time for the respective sections of the search area corresponding to the addresses. That is, the contents of the addressed storage areas of the memory 72 are fetched as signals 72s and are applied to a comparator 74 along with the degree-of-coincidence signals 65s delivered from the comparision and add circuit 65 in succession. The comparator 74 provides a pulse signal 74s when the degree of coincidence 65s obtained anew is greater. This pulse signal 74s is applied to an AND gate 75 which is controlled to be enabled or disabled by the degree-of-coincidence comparison instruction signal 70s. Only during the output period of the comparison instruction signal 70s, it is delivered from the AND gate 75 and becomes a pulse 75s permitting data renewal of the memories 72 and 73. The degree-of-coincidence memory 72 can accordingly store the new degree of coincidence given by the signal 65s, into its storage area corresponding to the address signal 70xy in response to the pulse signal 75s.

On the other hand, the coordinate memory 73 has coordinate storage areas corresponding to the address signals 70xy, likewise to the degree-of-coincidence memory 72. When the pulse signal 75s has been applied the coordinate memory 73 stores the coordinate data 60xy delivered from the timing control circuit 60, into the addressed storage area thereof.

Since the picture scanning is repeatedly performed in the X direction while shifting in the Y direction, the address of the section within the search area changes successively in accordance with the picture scanning. Therefore, when the scanning of one picture has ended, the maximum degrees of coincidence between the standard pattern and the local patterns as to all the sections and the position coordinates of the local patterns are respectively stored in the memories 72 and 73.

Figure 10:
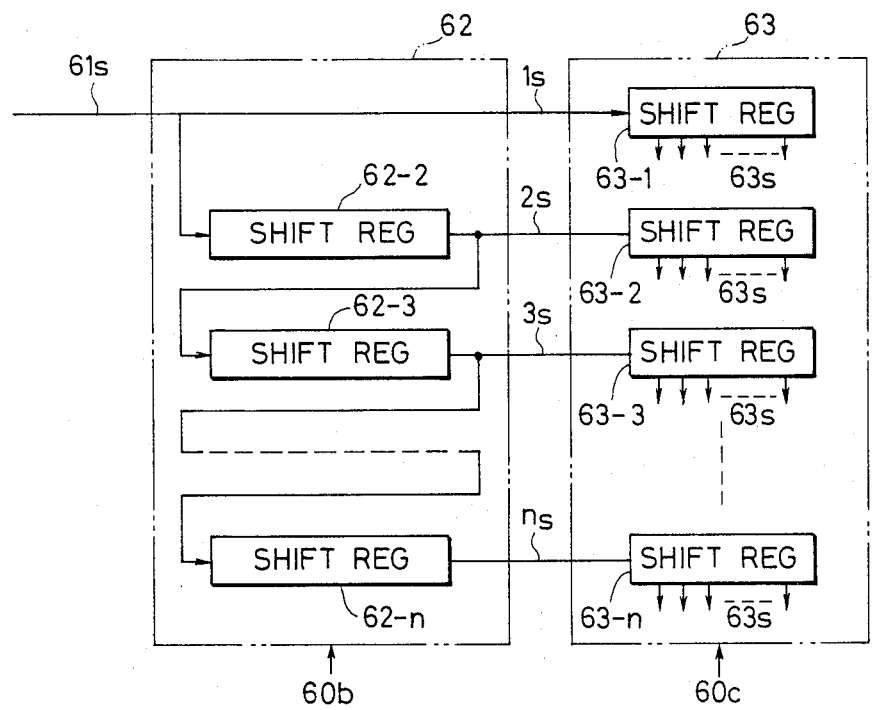
FIG. 10 is a diagram showing the concrete arrangement of an image memory (62) as well as a local pattern cutting circuit (63) in FIG. 9.

FIG. 10 shows an example of a specific circuit arrangement of the image memory 62 as well as the local patttern cutting circuit 63. Here, the image memory 62 consists of (n−1) shift registers 62-2 to 62-n which are connected in cascade to one another. The input of the first-stage shift register 62-2 is the output 61s of the thresholding circuit, and this signal is directly applied to the local pattern cuttting circuit 63 as a first input 1s. The outputs of the respective shift registers are applied to the cutting circuit as second to n-th input signals 2s to ns. Each of these shift registers 62-2 to 62-n has a memory capacity capable of storing information corresponding to one scanning line. The shift registers are so constructed that the outputs 1s to ns become n picture element signals in the positional relationship in which they are arrayed in the vertical direction in the imaging picture.

The local pattern cutting circuit 63 is composed of n shift registers 63-1 to 63-n each having a length of n' bits. Each shift register delivers signals serially applied from the image memory 62, as parallel signals 63s of n' bits.

Each shift register of the image memory 62 or the local pattern cutting circuit 63 executes an information shifting operation with the clock signal 60b or 60c which is delivered from the timing control circuit 60. Accordingly, by way of example, when the clock signal 60b at an interval corresponding to the scanning of one picture element is applied to each shift register of the image memory 62 every m-th scanning line and the clock signal 60c at an interval of m picture elements is applied to each shift register of the cutting circuit 63, a compressed two-dimensional local pattern of (n×n') picture elements sampled at vertical and horizontal intervals of m picture elements can be obtained. When the clock signals 60b and 60c at intervals of one picture element are applied every scanning line, a two-dimensional local pattern of normal size is obtained from the cutting circuit 63.

Figure 11:
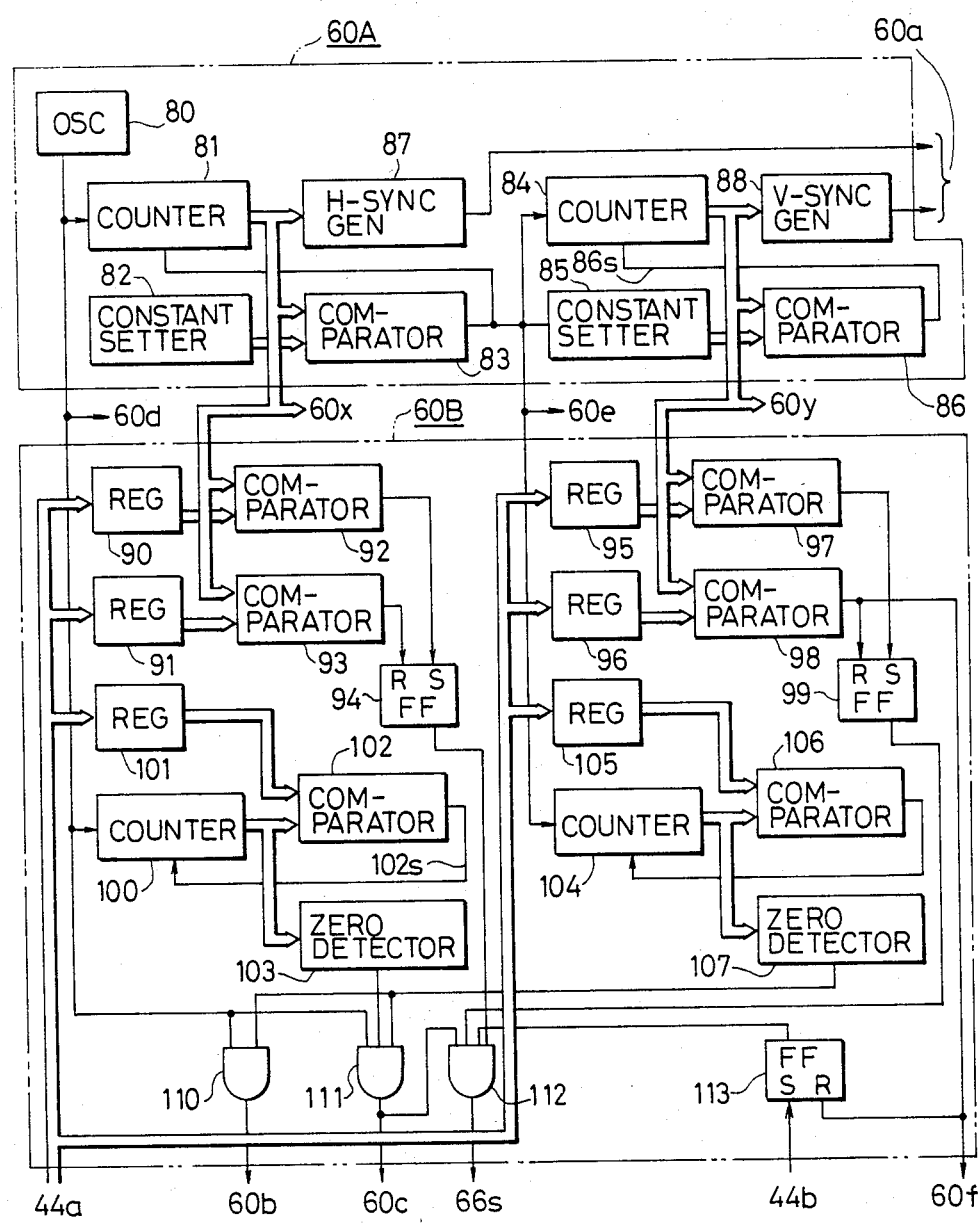
FIG. 11 is a diagram showing the concrete arrangement of a timing controller (60) in FIG. 9.

FIG. 11 shows an example of a specific circuit arrangement of the timing control circuit 60. This circuit consists of a first circuit portion 60A which generates the scanning point coordinates 60xy and the television camera synchronizing signal 60a, and a second circuit portion 60B which sets a search range in accordance with parameters given from the data processor 40 and which generates the clock signals 60b and 60c, the degree-of-coincidence comparison instruction signal 60s and the search end signal 60f.

The first circuit portion 60A has an oscillator 80 which generates the reference clock signal 60d at a period corresponding to the interval of one picture element, and it increments an X-coordinate counter 81 with the clock. The period of the counter 81 is held set in a constant setter 82, and the counter 81 is reset when it is detected by a comparator 83 that it has reached the period. In this way, the counter 81 repeatedly counts at the predetermined period. The output 60e of the comparator 83 is applied to a Y-coordinate counter 84 as a clock, and the counter 84 repeatedly counts at a predetermined period owing to the combination of a constant setter 85 affording the period and a comparator 86. Numerals 87 and 88 indicate horizontal and vertical synchronizing signal generator circuits, respectively. These synchronizing signal generator circuits transmit the synchronizing signals 60a having certain timings and widths, upon detecting that the contents of the X- and Y-coordinate counters 81 and 84 have become predetermined values, respectively.

The second circuit portion 60B includes registers 90 and 91 which hold the X coordinates $X_S$ and $X_E$ of the left end and right end of the search range as applied as signals 44a from the data processor 40, registers 95 and 96 which hold the Y coordinates $Y_S$ and $Y_E$ of the upper end and lower end of the search range, a register 101 which holds the sampling interval in the vertical direction, and a register 105 which holds the sampling interval in the horizontal direction. Numerals 92 and 93 designate comparators, which provide pulses when the contents of the registers 90 and 91 have coincided with the X coordinate 60x of the scanning point applied from the first circuit portion, respectively, so as to set and reset a flip-flop 94. Accordingly, the flip-flop 94 turns "on" only when the X coordinate is in a specified range. Regarding the Y coordinate, a flip-flop 99 is similarly set and reset by the registers 95 and 96 affording the upper and lower ends and comparators 97 and 98, so as to form a signal which turns "on" within a specified range only. The output of the comparator 98 becomes the signal 60f indicative of the search end.

Numeral 100 indicates a counter which is operated by the same clock 60d as that of the X-coordinate counter 81 in the first circuit portion. When its content has coincided with the sampling period held in the register 101, it is reset by an output 102s from a comparator 102 and returns into the zero content. Accordingly, the counter 100 repeatedly counts at the period held by the register 101. Numeral 103 indicates a circuit which detects that the content of the counter 100 is zero, and the output of which turns "on" for only one clock time in one period. Regarding the Y direction, a signal which turns "on" for the time of one horizontal scanning line in one period is similarly formed by a counter 104, the period register 105, a comparator 106 and a zero detector 107.

Shown at numerals 110–112 are AND gates, which form the clock signals 60b and 60c and the degree-of-coincidence comparison instruction signal 60s, respectively. More specifically, the AND gate 110 delivers the reference clock 60d for one horizontal scanning period every specified sampling interval in the Y direction, and this clock becomes the shift clock 60b of the image memory 62. The AND gate 111 delivers the clock sampled further in the X direction, and this clock becomes the shift clock 60c of the local pattern cutting circuit 63. The AND gate 112 delivers the clock 60c during only the time interval in which a flip-flop 113 is in its set status and in which the scanning point lies within the search ranges in the X direction and Y direction, and this clock becomes the degree-of-coincidence comparison instruction signal 60s. The flip-flop 113 is set by a start instruction signal 44b applied from the data processor 40, and is reset by the search end signal 60f. Therefore, the matching between the standard pattern and the local pattern is executed only for the scanning interval of one picture for which the data processor 40 has instructed the start.

Figure 12:
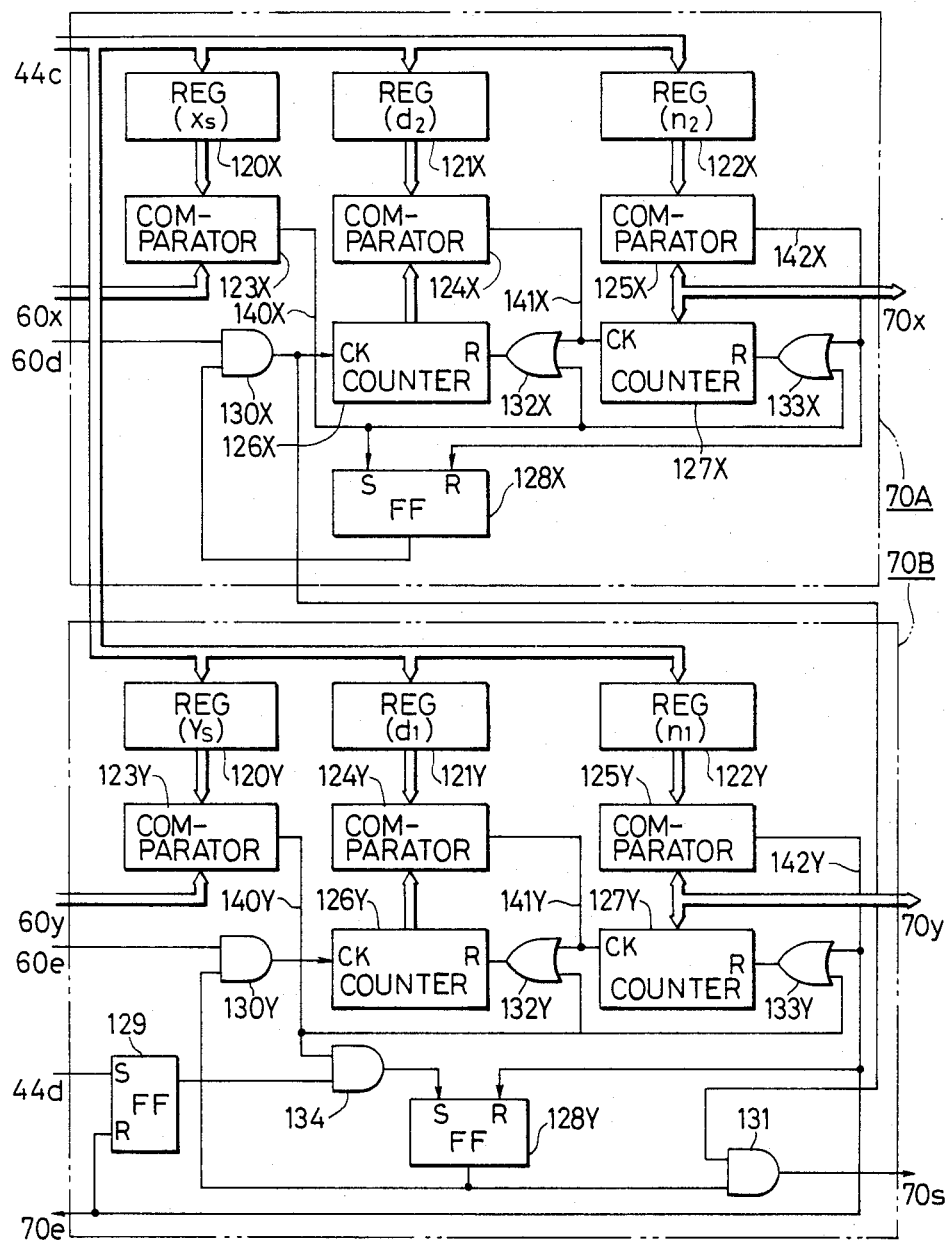
FIG. 12 is a diagram showing the concrete arrangement of an area partitioning circuit (70) in FIG. 9.

FIG. 12 shows an example of a specific circuit arrangement of the area partitioning circuit 70.

This circuit consists of an X-address control portion 70A and a Y-address control portion 70B. Symbols 120X and 120Y denote registers for holding the coordinates $X_s$ and $Y_s$ of a search starting point, respectively, symbols 121X and 121Y registers for holding the X-directional and Y-directional dimensions $d_2$ and $d_1$ of one partitioned section, and symbols 122X and 122Y registers for holding the numbers $n_2$ and $n_1$ of sections in the X direction and Y direction. The parameters to be held in these registers are sent as signals 44c from the data processor 40. In addition, symbols 123X, 123Y, 124X, 124Y, 125X and 125Y denote comparators, symbols 126X, 126Y, 127X and 127Y counters, symbols 128X, 128Y and 129 flip-flops, symbols 130X, 130Y, 131 and 134 AND gates, and symbols 132X, 132Y, 133X and 133Y OR gates.

First, the operation of the X-address control portion 70A will be described. The comparator 123X compares the X coordinate 60x of the scanning point delivered from the timing control circuit 60 and the coordinate $X_s$ of the search starting point held in the register 120X, and it provides a pulse signal 140X when they have coincided. This pulse signal sets the flip-flop 128X, and resets the values of the counters 126X and 127X into zero through the OR gates 132X and 133X, respectively. When the flip-flop 128X has fallen into its set status, the AND gate 130X is enabled by its output, and the fundamental clocks 60d are successively applied to the counter 126X, so that the counting operation is started.

The comparator 124X provides a pulse signal 141X when the value of the counter 126X has coincided with the lateral width $d_2$ of one partitioned section held in the register 121X. This pulse signal 141X is applied to the counter 127X so as to increment the count value by one, and is also applied to the reset terminal of the counter 126X through the OR gate 132X. Accordingly, the counter 126X repeats the counter operation every counter value equal to the lateral width of the partitioned section, and it increments the value of the counter 127X each time the scanning point shifts from one section to the next section in the X direction. Further, the content of the counter 127X is a value indicating which section in the horizontal direction the scanning is being performed in, and this value is delivered as a signal 70x indicating the X address of the section.

The comparator 125X compares the value of the counter 127X and the specified number $n_2$ of sections in the X direction as held in the register 122X, and it provides a pulse signal 142X when they have coincided. The pulse signal 142X is applied to the reset terminal of the counter 127X through the OR gate 133X so as to return the value of the counter to zero, and it resets the flip-flop 128X so as to disable the AND gate 130X and to block the input of the fundamental clock 60d. Since these operations are repeated every horizontal scanning line, the signal 70x indicative of the X address of the partitioned section within the search area is thus delivered repeatedly.

Next, the Y-address control portion 70B will be described. In the Y-address control portion, when a signal 44d instructing the start of a detecting operation has been delivered from the data processor 40, the flip-flop 129 is set and the AND gate 134 is enabled. The comparator 123Y compares the Y coordinate 60y of the scanning point delivered from the timing control circuit 60 and the coordinate $Y_s$ of the search starting point held in the register 120Y, and it provides a pulse signal 140Y when they have coincided. This pulse signal 140Y resets the counters 126Y and 127Y through the OR gates 132Y and 133Y, and if the AND gate 134 is in the enabled status, it sets the flip-flop 128Y through the AND gate. Thus, the AND gate 130Y is enabled, and the carry signals 60e delivered from the timing control circuit 60 at the respective horizontal scanning lines are successively applied to the counter 126Y, so that the counting operation is started.

The comparator 124Y provides a pulse signal 141Y when the value of the counter 126Y has coincided with the vertical width $d_1$ of one partitioned section held in the register 121Y. This pulse signal is applied to the counter 127Y so as to increment the count value by one, and it is also applied to the reset terminal of the counter 126Y through the OR gate 132Y so as to reset the value of the counter. Accordingly, the counter 126Y repeats the counting operation with its period being a count value equal to the vertical width of the partitioned section, and it brings the counter 127Y into the counting operation each time the scanning point shifts from one section to the next section in the Y direction. The content of the counter 127Y is a value indicating which section in the vertical direction the scanning is being performed in, and this value is delivered as a signal 70y indicating the Y address of the section. The signal 70y is applied to the degree-of-coincidence memory 72 and the coordinate memory 73 along with the signal 70x indicative of the X address.

The comparator 125Y compares the value of the counter 127Y and the specified number $n_1$ of sections in the vertical direction as held in the register 122Y, and it provides a pulse signal 142Y when they have coincided. This pulse signal 142Y resets the counter 127Y through the OR gate 133Y, and simultaneously resets the flip-flops 128Y and 129. In addition, the above pulse signal is sent to the data processor 40 as the end signal 70e of the specified pattern detection processing. Since the flip-flop 128Y is in the "on" status for just one scanning interval of the search area, the degree-of-coincidence comparison instruction signal 70s is obtained by deriving the AND output between the output signal of the flip-flop and the output signal of the AND gate 130X of the X-address control portion from the AND gate 131.

Now, there will be described the programmed operations of the data processor for controlling the automatic assembly system of the present invention.

Figure 13:
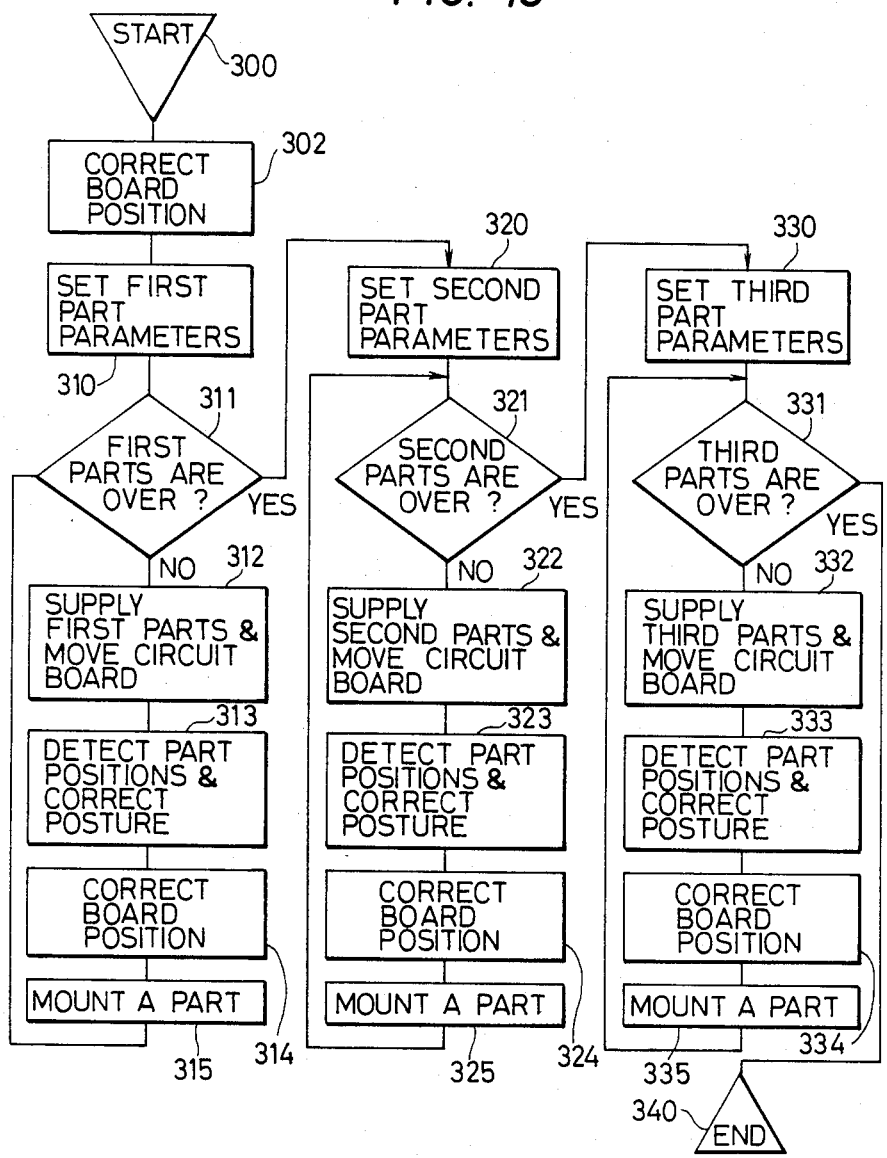
FIG. 13 is a program flow chart showing the schematic control procedure of the automatic mounting system.

FIG. 13 shows the fundamental operating procedure for mounting the three types of electronic parts (LSI, SSI, R), each type including a plurality of parts, on the single printed circuit board 1 in a predetermined sequence. A start routine 300 is started in such a way that an operator fixes the printed circuit board 1 to the moving table 20 and applies an assembly starting instruction from the input device 42. A routine 302 is for correcting the position of the printed circuit board. The positional deviations due to play between the holes 5 formed in the printed circuit board and the positioning pins disposed on the moving table 20, or the positional deviations of the printed wires are detected by utilizing the first television camera 34, whereupon the positions and senses of the printed wires are brought into agreement with the references axes x and y. Upon the end of the position correction, the control proceeds to a routine 310, in which various parameters required for the processings of the first parts (for example, LSI parts) are set. The setting of the parameters makes it possible to execute the assembly processings of the plurality of types of electronic parts with a common subprogram. By way of example, variables which indicate the type and number of the electronic parts, the kinds of standard patterns to be used, the positional relations of the imaging fields of view, search areas, area partitions, etc. are caused to correspond to the first parts. Numeral 311 indicates a routine which decides whether or not all the first parts have been mounted. If the first part to be processed remains yet, the control proceeds to a routine 312, and if all the first parts have been completed, it proceeds to a routine 320. In the routine 312, the first part is supplied from the work pallet 23 to the suction head 25, and the circuit board table 20 is moved so that the group of terminals on the printed circuit board side to be connected with the first part may lie under the suction head. The magnitudes of movement of the circuit board-moving table are stored in the memory in advance in the mounting sequence every type of the electronic parts. Thereafter, the control proceeds to a routine 313, in which the first part held by the suction head has its position detected and its posture corrected. Subsequently, in a routine 314, the circuit board-moving table 20 is moved in order to correct the positional deviation of the part, and in a routine 315, the suction head is lowered to mount the electronic part on the printed circuit board. Upon end of the routine 315, the control returns to the decision routine 311, and the above operations are repeated until the predetermined number of first parts are mounted.

Routines 320-325 and routines 330-335 perform similar processings for the second parts (for example, SSI parts) and third parts (for example, R parts), respectively. When all the third parts have been mounted, the control proceeds to an end routine 340, and a signal is delivered to the input/output device 42 so as to inform the operator of the end of the processings. In case an abnormality has been detected in any of the foregoing routines, the sequence of the program proceeds to the end routine 340, and the iput/output device 42 informs the operator of the occurrence and content of the abnormality.

The details of the position correcting routine 302 for the printed circuit board will be described with reference to FIGS. 14-16. The position correction of the printed circuit board 1 is made in such a way that the positions of the cross marks 6a-6d formed at the four corners of the printed circuit board are successively detected by the first television camera 34 and that the magnitudes of the positional deviations of the printed circuit board with respect to the x-y coordinate system of the circuit board are evaluated from the positional coordinates of the respective cross marks.

Figure 14:
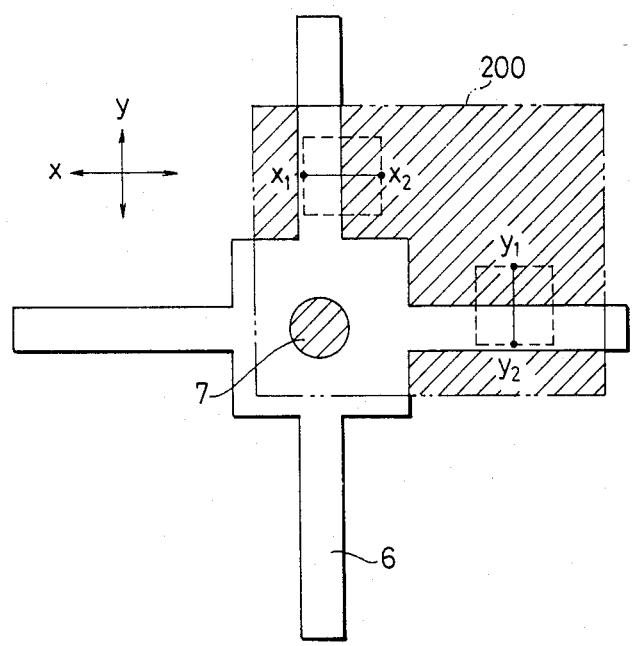
FIG. 14 is a diagram showing the relationship between an imaging field of view and the shape of a positioning cross mark formed on the printed circuit board (1)
Figure 15:
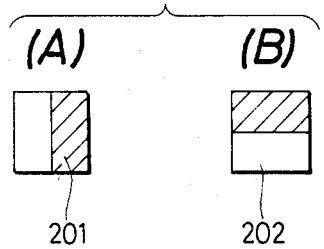
FIG. 15 is a diagram showing two standard patterns which are applied to the positional detection of the cross mark.

FIG. 14 shows an enlarged view of one cross mark. The cross mark portion 6 is made of a metal layer printed on the circuit board, and is imaged as a bright area on the television camera. Data which indicate the standard positions of the centers 7 of the respective cross marks relative to the origin of the circuit board-moving table 20, are stored in advance. By moving the circuit board-moving table 20 on the basis of the positional data in accordance with an instruction from the data processor 40, the imaging field of view in each stop position can be set at a position indicated by a two-dot chain line 200. Accordingly, in a case, for example, where two small search areas $x_1-x_2$ and $y_1-y_2$ as shown in the figure are set at predetermined distances from the central position of the standard cross mark and where pattern matching operations are carried out by employing a standard pattern 201 shown in (A) of FIG. 15 in the first search area ($x_1-x_2$) and a standard pattern 202 shown in (B) of FIG. 15 in the second search area ($y_1-y_2$), the X and Y coordinates of the actual mark center position can be obtained from the coordinates of local pattern cutting-out positions indicating the maximum degrees of coincidence with the standard patterns as detected in the respective search areas. Each search area in this case can be set in a range in which only one pattern having the same feature as that of the standard pattern exists, and hence, patterns of high resolution which are not sampled can be applied to the standard patterns 201 and 202.

Figure 16A:
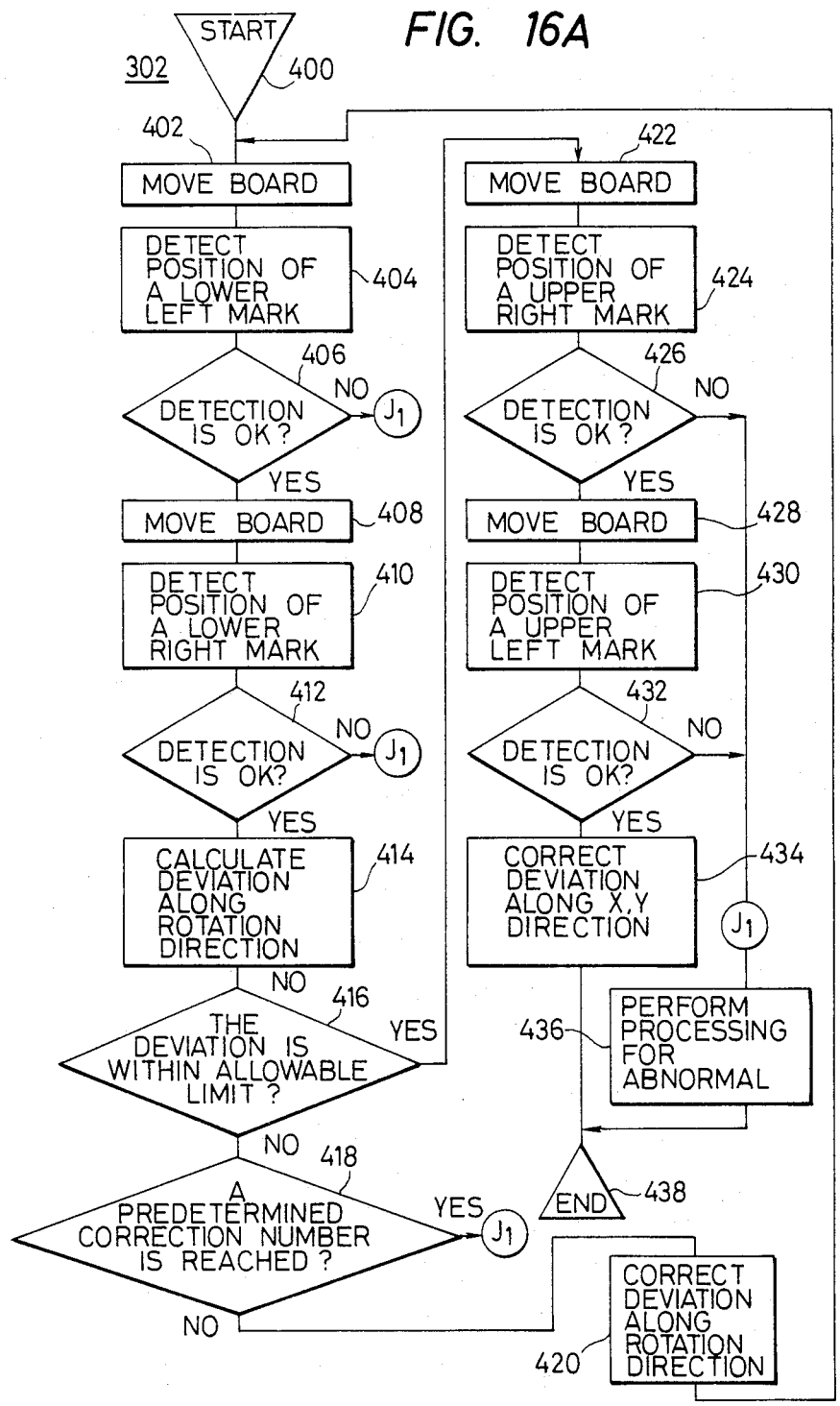

FIG. 16A is the detailed program flow chart of the routine 302 for successively detecting the four cross marks 6a-6d with the above-stated method so as to correct the positional deviation of the printed circuit board. In this program, the printed circuit board is moved to the position of the lower left mark 6a by a routine 402, and the mark position is detected by a routine 404. Upon end of this routine, the result of the detection is decided in a decision routine 406. When the mark detection has ended normally, the control proceeds to a routine 408, whereas when the operation has failed in the mark detection, the control proceeds to an abnormal termination processing routine 436. In routines 408-412, the position of the lower right mark 6b is detected likewise to the above. When the positional detection on the lower right mark 6b has ended normally, the control proceeds to a routine 414, in which the magnitude of rotational deviation is calculated from the difference of the X coordinates of the right and left marks. When the magnitude of deviation in the rotational direction is within allowable limits, the control proceeds from a decision routine 416 to a routine 422, and when not, the control proceeds to a decision routine 418 in which the number of rotational deviation corrections already made is checked. If a predetermined number of corrections have been made, the automatic correction is deemed to be impossible and the operation is brought to the abnormal termination, and if not, the circuit board-moving table 20 is caused to perform a correcting operation round the z-axis and the control is returned to the routine 402. In routines 422-432, the upper right mark 6c and the upper left mark 6d are detected similarly to the routines 402-414. When the position detections on all the marks have ended normally, the control proceeds from the decision routine 432 to a routine 434, in which the magnitudes of deviations in the X and Y directions are calculated in order to bring the printed circuit board into agreement with the reference position thereof and the circuit board-moving table 20 is driven in the direction of correcting them. By the program processings, the printed circuit board 1 has been located at the origin of the reference x-y coordinate system. The part mounting areas can be successively positioned directly under the suction head 25 by numerically controlling the circuit board-moving table 20 with the origin as a starting point.

Figure 16B:
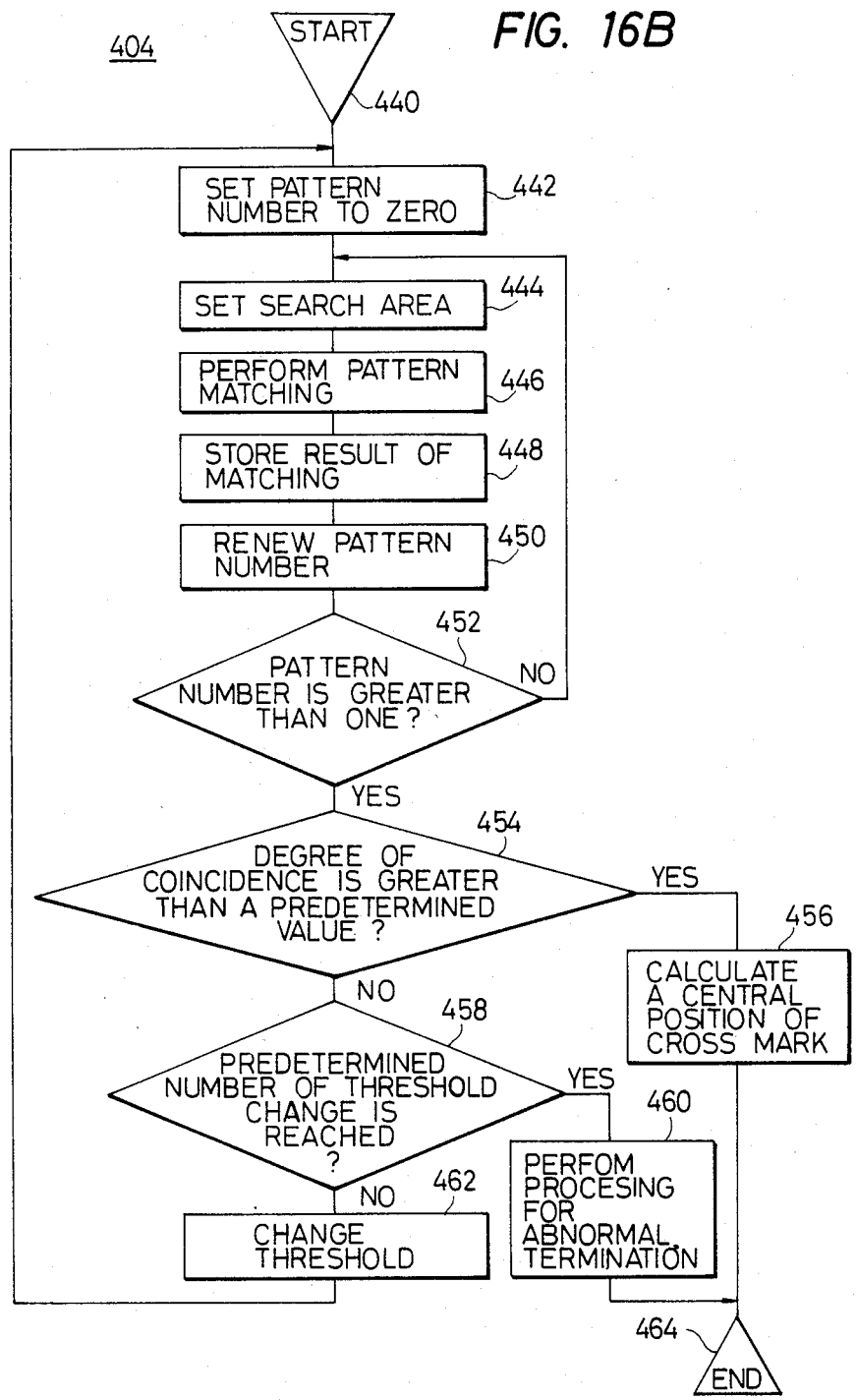
FIG. 16B is a program flow chart showing a more detailed procedure of a mark position detecting routine (404) in FIG. 16A.

FIG. 16B is the detailed flow chart of a subprogram which corresponds to the mark position detecting routines 404, 414, 424 and 430 in the above program. In this subprogram, various parameters are initialized in a start routine 440, whereupon No. of a parameter appointing a standard pattern is set to '0' in a routine 442. When this No. is '0', the first search area $(x_1-x_2)$ is appointed in a routine 444, and a fine pattern matching operation employing the standard pattern 201 is performed in a routine 446. That is, signals 44a, 44k and 44b in FIG. 9 are provided. When the end signal 60f has been delivered from the pattern detector circuit 50, a routine 448 is executed in which signals 44n and 44i are provided to load the contents of the registers 65' and 66 into the memory 41. In the next routine 450, pattern No. is increased by one. If pattern No. is not greater than one, the control proceeds from a decision routine 452 back to the routine 444, in which a pattern matching operation similar to the above is carried out in the second search area $(y_1-y_2)$ by the use of the standard pattern 202. When the pattern matching in the second search area is over, the control proceeds to a routine 454, which decides whether the two data on the degree of coincidence as loaded in the memory 41 are greater than predetermined values or not. When they are greater than the predetermined values, the central position of the cross mark is calculated in a routine 456, whereupon the control proceeds to an end routine 464. If the degree of coincidence is smaller than a prescribed value, the number of changes of a threshold value is checked in a routine 458. The threshold value has influence on the degree of coincidence of the pattern matching. When a predetermined number of changes are already over, the control proceeds to a routine 460 in which a processing for abnormal termination is performed. When they are not over, the threshold value is changed slightly from the present value in a routine 462, and the control is returned to the routine 442. The change of the threshold value is achieved by changing the value of a data to be delivered as a signal 44f.

FIG. 17 is the detailed program flow chart of the routine 312 (322 or 332) in FIG. 13. In this program, the parts are first supplied from the feeder 22 to the work pallet 23 (routine 472), the circuit board-moving table 20 is moved to the next part mounting position in accordance with positional data stored in advance (routine 474), and the work pallet 23 is moved forward a predetermined distance (routine 476). The work pallet stops in a position where the part 10 has come directly under the suction head 25⊖. Subsequently, the suction head 25 is lowered a predetermined distance from its initial position (routine 478), and a suction valve is opened to move the part by suction (routine 480). Thereafter, the suction head is raised to a position where the lower end of the part is perfectly spaced from the topside of the work pallet (routine 482), and the work pallet is moved back to its initial position where it receives the next part (routine 484). When the work pallet has withdrawn, the suction head 24 is lowered a predetermined distance (routine 486), and the reflector plate 27 is inserted directly under the part (routine 488). At this time, the suction head stops in a position where the leads 11 of the part agree with the focal distance of the objective lens 31.

FIG. 18 shows the detailed program flow chart of the part mounting routine 315 in FIG. 13. In this program, after the reflector plate has been reset to its initial position (routine 502), the suction head 25⊖ is lowered to the surface position of the printed circuit board (routine 504), and it is further lowered a predetermined distance so as to apply the back pressure for the temporary bonding (routine 506). Thereafter, it is reset to its initial position (routine 508).

Now, the detailed program flow chart of the part position correcting routine 313 (323 or 333) in FIG. 13 will be described with reference to FIG. 19.

As already explained with reference to FIGS. 2-4, in this embodiment, the imaging areas of mutually different positions are set in the three places for the LSI part or the SSI part and in the two places for the R part, and the positional deviation of the electronic part held in the suction head are judged from the positional relations of the leads detected in the respective imaging areas. These areas are imaged by the second television camera 30. In the presence of the positional deviation of the electronic part, the positional deviation in the X or Y direction is corrected by moving the printed circuit board by means of the circuit board-moving table, and only the positional deviation in the rotational direction is corrected by the rotating operation of the suction head.

The program of the part position correcting routine shown in FIG. 19 moves the objective lens 31 to the first detection position, e.g., the imaging area 13a in a routine 522, and detects in a routine 524 the position of the lead 11a imaged at the endmost position. Next, the objective lens 31 is moved to the second detection position, e.g., the imaging area 13b in a routine 526, and the position of the lead 11b imaged at the endmost position is detected in a routine 528. When the positions of the two leads have been detected in this way, the magnitude of rotational deviation of the electronic part round the z-axis can be calculated from the X and Y coordinates of the respective leads in a routine 530. As understood from FIGS. 2, 3 and 5, since the leads are bent in the shape of a crank, they involve a dispersion in their lengthwise direction, that is, in the y-axial lengths as to the leads 11a and 11b, but they have a high positional accuracy in the axial direction orthogonal thereto. Accordingly, the X coordinates of the two leads 11a and 11b detected in the first and second detection positions can be used for calculating the exact x-axial position of the electronic part, and the calculation is performed in the routine 530. In a routine 532, the driver of the suction head is operated in the direction of correcting the positional deviation in accordance with the rotational deviation magnitude calculated in the preceding routine 530. In a decision routine 534, the amount of the correction is compared with a predetermined value. When the correction amount is greater, the control returns to the routine 522 and the above-stated operations are repeated again, and when not, the control proceeds to a routine 536. In the routine 536, it is decided whether or not the sort of the part being presently processed is the R part. In case of the R part, the control proceeds to a routine 538, which calculates the Y coordinate of the part from the Y coordinates of the two leads already detected, and it further proceeds to an end routine 546. In case of the LSI part of SSI part, the control proceeds from the decision routine 536 to routines 540 and 542, in which the lead 11c is detected in the third detection position 13c. On the basis of the Y coordinate of the lead 11c, the exact Y coordinate of the part is calculated in a routine 544.

In the part position correcting program described above, the routine 524, 528 or 542 for detecting the position of the lead requires a mechanism for selecting the specified lead from among a large number of leads in the same shape included within the imaging field of view. In the present invention, therefore, as shown in FIG. 20, a plurality of leads are first detected by the use of a coarse standard pattern in which features in a wide range are compressed by sampling (routine 552). In the detection of the plurality of leads, there is adopted a method in which a set search area is partitioned into a plurality of sections and in which the maximum degree of coincidence between the standard pattern and the local pattern cut out from the picture is evaluated every partitioned area. Thus, the endmost lead aimed at can be specified from the positional correlation of the plurality of leads detected. Whether or not the coarse position detection has been successful, is decided in a routine 554. When it has been unsuccessful, the control proceeds to an abnormal termination routine 560, and when it has been successful, the control proceeds to a routine 556. In the routine 556, on the basis of the coarse positional data of the leads already specified, a search area of narrow range is set in the same manner as performed in the detection of the cross mark, and a pattern matching operation is executed by the use of a fine standard pattern without sampling. Thus, the exact X and Y coordinates of the lead aimed at can be obtained. A routine 558 decides whether the fine positional detection has been successful or not. When it has been unsuccessful, the control proceeds to the abnormal termination routine, and when it has been successful, the control proceeds to the end routine 562.

Figure 21:
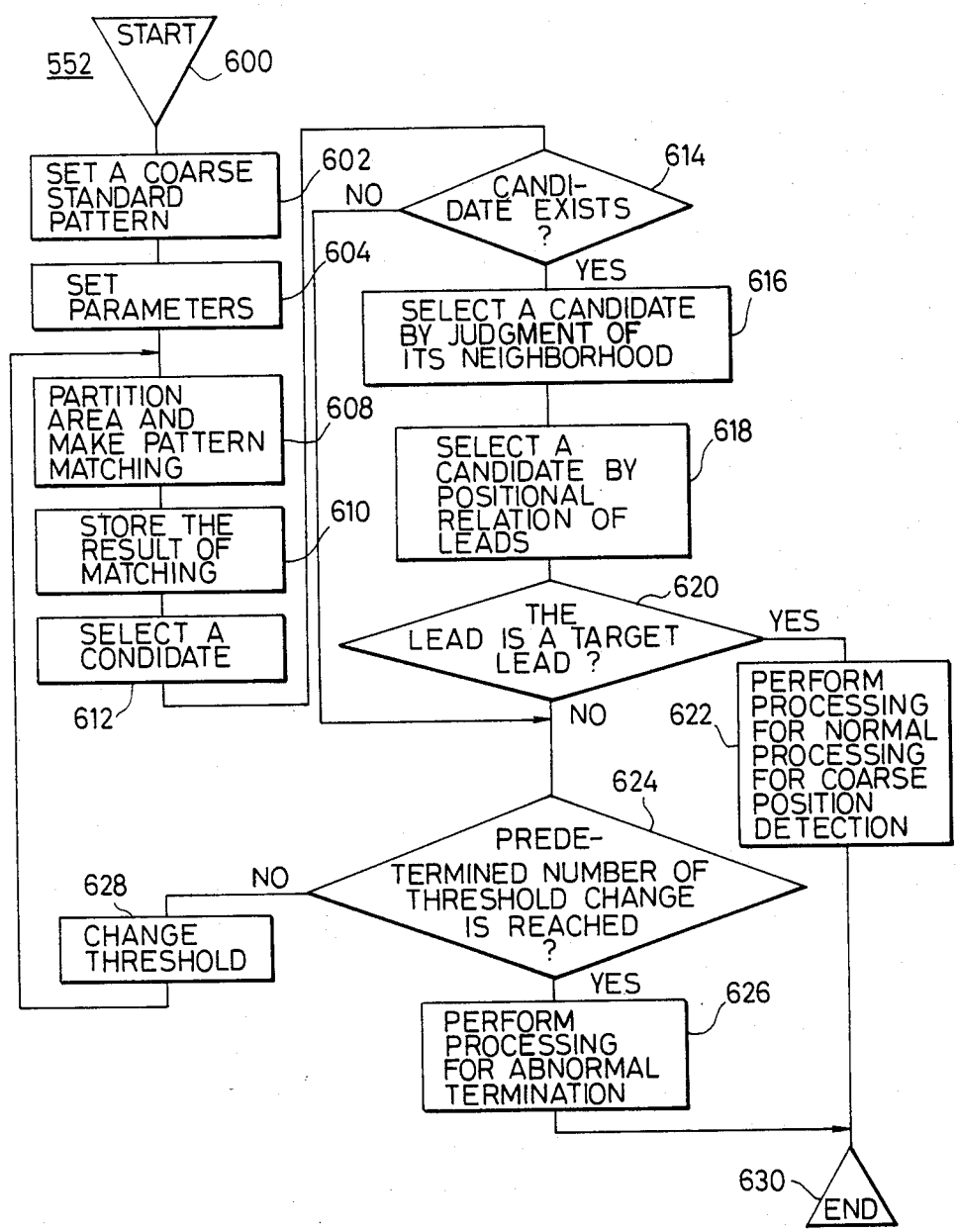
FIG. 21 is a program flow chart showing a more detailed procedure of a routine (552) for detecting the coarse position of a lead in FIG. 20.

The details of the coarse position-detecting routine 552 will be described with reference to a subprogram flow chart of FIG. 21 and FIG. 22.

In this program, the coarse standard pattern for use in the pattern matching is first set into the register 64 as the signal 44k in a routine 602. The standard pattern to be used differs depending upon the sort of the electronic part and the imaging area thereof, in other words, the first to third detection positions, and it is appointed by parameter setting before the branch to this subprogram. For example, in the second detection position of the LSI part, the leads are imaged in the imaging area 13b as illustrated in (A) or (B) of FIG. 22, and a standard pattern shown in FIG. 23 is used as one for detecting the positions of the fore end parts of the respective leads. This standard pattern 220 consists of 12×12 picture elements, and contains a feature pattern agreeing with the fore end part of the lead as indicated by a broken-line frame 221 in (A) of FIG. 22. Similar standard patterns are prepared for the respective sorts of the leads and in correspondence with the respective detection positions.

In a routine 604, a parameter for appointing the sampling interval and a parameter for partitioning the imaging area into the plurality of sections are respectively supplied to the timing control circuit 60 and the area partitioning circuit 70 as the signal 44a and the signal 44c. Thus, the search area partitioned into the sections 210–214 as shown by way of example in (A) or (B) of FIG. 22 is set. It is determined by the size and interval of the leads included in the sections. Numeral 608 indicates a routine which detects the position of the local pattern incident most with the standard pattern every such partitioned section, and in which the start instruction signal 44d is delivered from the data processor 40 to the area partitioning circuit 70 and the pattern detecting circuit 50 is operated. When the area partitioning circuit has provided the end signal 70e, the data of the respective sections are read from the coordinate memory 73 and the degree-of-coincidence memory 72 by a routine 610. Among these data, only ones exceeding a predetermined value in the degree of coincidence are selected as the candidate data of the leads in a routine 612. Numeral 614 indicates a routine for deciding the presence or absence of the selected candidate data. If there is no candidate data, the control proceeds to a routine 624, which decides whether or not a predetermined number of changes of a threshold value have been already made. If the predetermined number of changes of the threshold value have ended, the control proceeds to a routine 626 which performs a processing for abnormal termination, and if not, the threshold value is changed in a routine 628 and the processings from the routine 608 are performed again. In the presence of the candidate data of the leads, the control proceeds from the routine 614 to a routine 616, which examines the positional relation of the candidates. Here, in case two or more candidates exist in a very close positional relationship, one candidate having the maximum degree of coincidence is left among them, and the others are erased. This measure is taken because data registries can occur in two or more sections as to one lead, depending upon the positional relationship between the lead and the sections. In a routine 620, the presence or absence of the target lead in the candidates thus arranged is decided on the basis of the positional relationship of the X and Y coordinates. If the endmost target lead has been found, the control proceeds to a routine 622 in which the position coordinates of the specified point of the lead, for example, the coordinates of a point Q in FIG. 22 are calculated, whereupon the control proceeds to an end routine 630. If the target lead has not been found, the control proceeds to the routine 624 so as to decide whether or not the pattern detection is to be made again by changing the threshold value.

Now, the details of the fine position detecting routine 556 will be described with reference to a program flow chart of FIG. 24 and FIGS. 25 and 26. Since, in the above-stated coarse position detection, the sampled coarse standard pattern is employed, the X and Y coordinates of the specific point Q obtained involve errors corresponding to the sampling intervals. Therefore, $x_1-x_2$, $x_3-x_4$ and $y_1-y_2$ lying in specified positional relations with the coordinates of the point Q are appointed as first, second and third search areas as shown in FIG. 25, and position detections employing precise standard patterns shown in (A), (B) and (C) in FIG. 26 are performed in the respective areas. Each of these standard patterns is also composed of $12 \times 12$ picture elements. Thus, the exact X coordinate of the point Q is evaluated from the center of the X coordinates obtained in the first and second search areas, and the exact Y coordinate of the point Q is evaluated from the Y coordinate obtained in the third area.

Figure 24A:
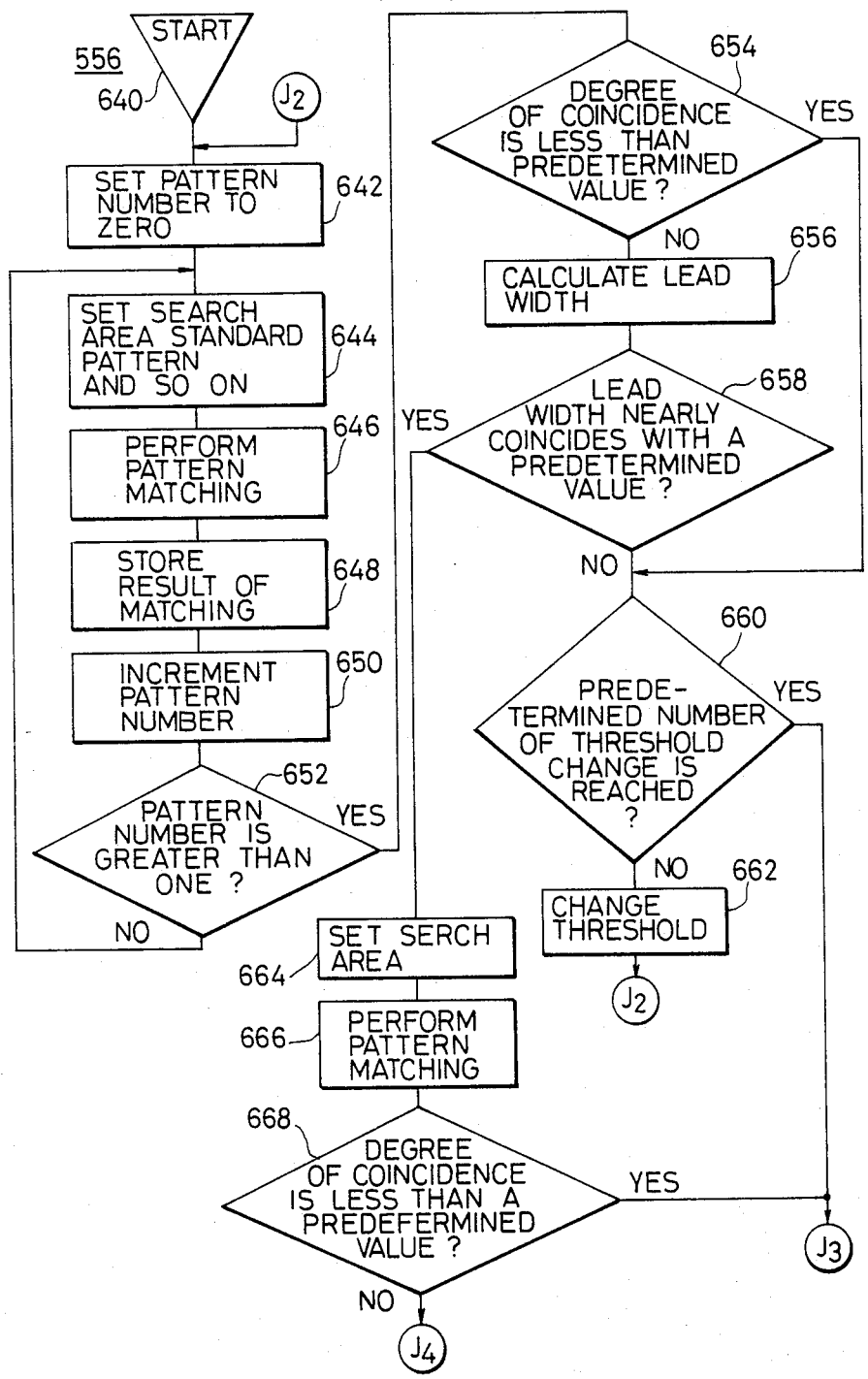

In the program of FIG. 24, first of all, No. '0' is set by a routine 642 as a parameter indicative of a standard pattern to be used. When the number is '0', the data processor operates so that, in routines 644–648, a pattern matching operation employing, e.g., the standard pattern 231 in (A) of FIG. 26 and appointing $x_1-x_2$ as the search area is executed, whereupon detected X and Y coordinates and degree-of-coincidence data are registered in predetermined memory areas corresponding to the number. The aforementioned parameter is incremented +1 in a routine 650. A decision routine 652 decides whether or not this value is greater than one. When it is greater than one, the control proceeds to a routine 654, and when not, the control returns to the routine 644. Thus, a pattern matching operation employing the standard pattern 232 and appointing $x_3-x_4$ as the search area is executed in correspondence with No. '1'.

The routine 654 decides whether or not the degree of coincidence obtained through the two pattern matching operations is less than a predetermined value. When the degree of coincidence is lower, the control proceeds to routines 660 and 662, in which the image thresholding value is changed so as to perform the processings from the routine 642 again. When the higher degree of coincidence is attained, the control proceeds from the routine 654 to a routine 656, in which the width of the lead is detected from the two X coordinates. The lead width is decided by a routine 658 as to whether or not it falls within an allowable range of standard values determined every part in advance. If an error is too large, the control proceeds to the routine 660 so as to change the image thresholding value. If the lead width lies within the allowable range, the control proceeds to routines 664 and 666, in which a pattern matching operation employing the standard pattern 233 is performed in the third search range $y_1-y_2$. The result of the matching is decided in a routine 668. If a higher degree of coincidence is attained, the control proceeds to a routine 670, in which the X and Y coordinates of the central point Q of the lead are calculated. Subsequently, the results of the calculation are stored in predetermined memory areas corresponding to the imaging field of view in a routine 672, whereupon the control proceeds to and end routine 676.

The above description has been made on the position detection of the lead extending in the y-axial direction in the imaging area 13b. In the first or third imaging area 13a or 13c in which the lead is opposite in sense to or intersects orthogonally to the above lead, a standard pattern 234 shown in (D) of FIG. 26 becomes necessary. In addition, in the second and third imaging areas, the X coordinates and Y coordinates for calculating the widths of leads and the central positions thereof fall into the inverse relation. As regards these items, processing contents may be determined by referring to parameters indicative of the type and imaging area of the part at the particular point of time in the individual routines of the program in FIG. 24. Therefore, this program can be applied in common to the plurality of imaging fields of view in the plurality of types of parts. Moreover, the standard patterns in FIGS. 26 and 15 can be used conjointly.

FIG. 27 shows as a time chart the operations of the various portions from the suction of one part till the mounting thereof onto the circuit board as based on the foregoing program control.

As set forth above, the automatic assembly system of the present invention employs two imaging devices so as to detect the position of a circuit board by means of the first imaging device and to detect the position of a part by means of the second imaging device. By employing the two imaging devices in this manner for the detection objects located at heights different from each other, a focusing operation is dispensed with, and processing time is shortened, to enhance a detection accuracy and to simplify an imaging system-positioning mechanism. In addition, according to the present invention, the position of the part is detected from the results of feature detections performed in a plurality of imaging fields of view, so that parts of different sizes can have their positions detected by the same recognition procedure. Especially in case of adopting a method in which the imaging fields of view are switched by the movement of an objective lens, the recognition processings can be realized with a simple mechanism and in a short time. In this case, when the part is illuminated from its rear and the silhouette thereof is picked up as shown in FIG. 6, not only the disturbance of the shape of the part attributed to the reflection of light from the curved surface of the part can be prevented, but also the pattern of a circuit board surface behind the part can be shut off so as to image only the part. This brings forth the advantage that a pattern misrecognition can be prevented. In the embodiment, the light reflector plate is inserted between the part and the circuit board so that the laterally projected light from the projector may be reflected upwards by the light reflector plate so as to image the silhouette of the part. Since, however, the reflector plate may be inserted at the position detection of the part and withdrawn from underneath the suction head at the part mounting, the work pallet 24 in FIG. 6 may well be used also as a light reflector plate so as to omit the elements 27 and 28. In this case, the part receiving portion 24 of the work pallet may be constructed of a transparent member inside which a light source is contained, or a reflector plate may be installed inside the part receiving portion 24 so as to upwardly reflect light from the projector 29.

Although the assembly operations of stacking the electronic parts such as LSI onto the terminal forming surface of the printed circuit board have been referred to in the embodiment, it is to be understood that the characterizing construction of the present invention is also applicable to the automation of assembly operations other than in the embodiment, for example, operations of inserting parts into apertures provided in a circuit board.

What is claimed is:

1. An automatic assembly system wherein parts supplied from a feeder are held by a holder means and are automatically mounted onto predetermined positions of a circuit board; comprising a first image pickup device which images at least a portion of said circuit board, said first image pickup device has a fixed field of view and receives images of a plurality of places on said circuit board, a second image pickup device which images at least a portion of the part held by the holder means, said second image pickup device has a movable field of view and receives images of a plurality of places on said part held by the holder means with said holder means kept fixed, a signal processor means which processes an output of said first image pickup device to detect a deviation of said circuit board from a reference position and which also processes an output of said second image pickup device to detect a magnitude of deviation between said part and the predetermined position of said circuit board, said signal processor means processes the plurality of input images from said first and second image pickup devices so as to detect the respective positional deviations of said circuit board and said part, and a positioning device which operates under control of said signal processor so as to adjust said predetermined position of said circuit board to a position opposing to said part and also to move said part toward said circuit board.

2. An automatic assembly system as defined in claim 1, wherein said second image pickup device consists of an objective, an eyepiece and a television camera, and the imaging field of view is changed by moving a position of said objective.

3. An automatic assembly system as defined in claim 1, or 2, wherein said positioning device consists of first positioning means capable of moving said circuit board in directions of X- and Y-axes and a rotational direction round a Z-axis intersecting orthogonally to the X- and Y-axes, and second positioning means capable of moving parts feeder in a direction of the Z-axis and the rotational direction round the Z-axis, and wherein said signal processor controls the positioning of said first positioning means in the rotational direction round the Z-axis in response to the processed result of the output signal of said first image pickup device, and makes the positioning controls of said second positioning means in the rotational direction round the Z-axis and said first positioning means in the directions of the X- and Y-axes in response to the processed result of the output signal of said second image pickup device.

4. An automatic assembly system for mounting a first element on a second element comprising:
means for holding the first element without exact adjustment of a positional displacement of the first element with respect to said means for holding and without exact adjustment of an angular rotation of the first element;
first means for detecting an angular orientation and a position of the first element;
second means for detecting an angular orientation and a position of the second element;
means for moving the means for holding in a predetermined direction by a predetermined amount toward the second element in order to mount the first element held by the means for holding on the second element; and
means coupled to the means for holding and the second element for controlling a relative position and a relative angular orientation respectively of the first and second element to first and second predetermined values, and first and second values enabling the first element to be moved to a predetermined mounting point on the second element within a predetermined angular orientation with respect to the second element when the movement by the means for moving is performed, said controlling of relative position and relative angular orientation being performed in response to the detected positions and orientations of the first and second elements before the first element reaches the mounting point.

5. An automatic assembly system of claim 4, wherein said means for controlling includes:
third means for rotating said means for holding in response to the detected angular orientation of the first element so that the first element has a predetermined angular orientation;
fourth means for rotating said second element in response to the detected angular orientation of the second element so that the second element has a predetermined angular orientation;
means for positioning the second element; and
fifth means for controlling the means for positioning the second element in response to combination of the detected positions of the first and second element so that the relative position has the first value.

6. An automatic assembly system of claim 5, further comprising:
means for serially feeding a plurality of the first elements to the means for holding, said first elements being adapted for mounting on different mount points on the second element;
means for operating said first means, said moving means, and said third means for each of the first elements; and
means for controlling the means for positioning for each of the first elements succeeding the first one of the plurality of the first elements in response to the combination of each detected position for each succeeding first element and a positional difference between two succeeding mounting points so that each succeeding element can be moved to a corresponding mounting point when the movement by the means for moving for each succeeding element is performed.

7. An automatic assembly assembly system of claim 6, wherein said first means comprises image pick-up means located to image at least two different positions of the first element held by the means for holding, and means for processing an output of the image pick-up means to detect the orientation and position of the first element.

8. An automatic assembly system of claim 7, wherein said second means comprises a second image pick-up means located to image at least a portion of the second element, said means for processing including means for processing outputs of the first and second image pick-up means in a time sequential manner to detect the orientation and position of the first element and detect the position and orientation of the second element.

9. An automatic assembly system for mounting a first element supplied by a feeder on a second element, comprising:
means for holding the first element supplied by the feeder at a position above a predetermined mounting point on the second element without adjustment of a horizontal displacement of the first element with respect to the holding means;
means for detecting the horizontal displacement of the first element with respect to the means for holding;
means for moving said means for holding along a predetermined vertical path toward the second element to mount the first element on the second element at the mounting point;
means coupled to said means for holding and said second element for controlling a relative position of said held first element and the second element, said control being done in response to said detected horizontal displacement before said first element reaches the mounting point by movement of the means for holding by said means for moving.

10. An automatic assembly system of claim 9, wherein said means for holding includes a vacuum suction means for holding the first element at a top surface of the first element.

11. An automatic assembly system of claim 9 wherein said means for controlling comprises:
means for positioning said second element in a horizontal plane; and
means for controlling said means for positioning in response to said detected horizontal displacement in order to compensate for the horizontal displacement of the first element.

12. An automatic assembly system of claim 9, wherein said means for detecting comprises:
image pick-up means located above said first element to image at least a portion of the held first element; and
means for processing an output of the image pick-up means to detect the horizontal displacement of the held first element.

13. An automatic assembly system for mounting a first element supplied by a feeder on a second element, comprising;
means for holding the first element supplied by the feeder at a position above a predetermined mounting position on the second element without adjustment of an angular rotation of the held first element;
means for detecting an angular orientation of the held first element;
means for moving said means for holding along a predetermined vertical path toward the second element to mount the first element on the second element at the mounting position point; and
means coupled to said means for holding and said second element for controlling a relative angular orientation of said held first element and said second element, said control being done in response to said detected angular orientation before said first element reaches the mounting position by movement of the means for holding by said means for moving.

14. An automatic assembly system of claim 13, wherein said means for holding comprises a vacuum suction means for holding said first element at a top of the first element.

15. An automatic assembly system of claim 13, wherein said means for controlling comprises means for rotating the means for holding in response to said detected angular orientation so as to provide the held first element with a predetermined angular orientation.

16. An automatic assembly system of claim 13, wherein said detecting means comprises:
image pick-up means located above said first held element to image at least two different portions of the held first element; and
means for processing an output of said image pick-up means to detect the angular orientation of the held first element.

17. An automatic assembly system of claim 13 wherein said image pick-up means includes means for changing serially a position of an objective lens included in said image pick-up means so as to change a field of view of said image pick-up means in order to enable said two different portions to be imaged.

18. An imaging system for use in an automatic assembly system for mounting a first element held above a second element onto the second element, comprising:
image pick-up means located above said first held element to image at least a portion of the first element;
means for processing an output of said image pick-up means to detect at least either one of a position and an angular orientation of the first element; and
means, interposed between said image pick-up means and said second element, for preventing the second element being imaged by said image pick-up means below the portion of the first element being imaged.

19. An imaging system of claim 18, wherein said processing means includes means for performing the detection in response to an image signal from peripheral portions of the first element.

20. An imaging system of claim 18, wherein said means for preventing comprises shield means interposed between the first and second element, and means for moving the shield means, after the image of the first element is obtained, to a position which does not prevent movement of the first element toward the second element.

21. An imaging system of claim 20, wherein said shield means comprises a light reflecting means which prevents light from the second element from reaching the image pick-up means and allows light from a light source to reach the image pick-up means in order to illuminate the first element from below.

22. An imaging system for use in an automatic assembly system for mounting a first element held by a holder over a second element onto the second element, comprising:
image pick-up means located above said first element to image a portion of the first held element;
means for moving an objective lens included in said image pick-up means so as to enable said image pick-up means to image different portions of the first element; and
means for processing images provided by said image pick-up means from said different portions so as to detect at least either one of a position or an angular orientation of the first element.

23. An automatic assembly system for mounting an electric component having leads extending outwards from a body supplied by a feeder means on a circuit board in such a manner that the electric component is located at a predetermined position on the circuit board with a predetermined angular orientation, comprising:
- means for holding the component by the body of the electric component supplied by the feeder means;
- image pick-up means located at a position to image at least predetermined ones of the leads of the component;
- means for processing an output of said image pick-up means of either one of a position or an angular orientation of said component in response to image signals representing said predetermined leads; and
- means for moving said means for holding toward said circuit board, along a predetermined path; and
- means connected to said means for holding and said circuit board for controlling at least either one of a relative position or a relative angular orientation of the component and the board, in response to a detection result of said processing means, and before said component is mounted on said board.

24. An automatic assembly system of claim 23, wherein said means for holding includes vacuum suction means for holding the component at a top of the body.

25. An automatic assembly system of claim 23, wherein said means for holding includes means for holding said component so that said predetermined leads extend horizontally; and wherein said image pick-up means is positioned above the component so as to image the horizontally extended leads from above the component.

26. An automatic assembly system of claim 25, wherein said image pick-up means includes means for allowing imaging first predetermined leads at a first time and imaging second predetermined leads at another time; and wherein said processing means includes means for detecting an angular orientation or a position of said component in response to images for the first and second predetermined leads.

27. An automatic assembly system of claim 26, wherein said means for allowing includes means for moving an objective lens included in said image pick-up means to two positions respectively enabling said first and second predetermined leads to be imaged.

28. An automatic assembly system of claim 25, wherein said means for holding is provided above the board and said means for moving includes means for moving said holding means vertically toward the board; and said means for controlling functions to position control said relative position so as to allow said component to be moved to the predetermined position on the board when the means for holding for movement vertically to the board by said means for moving.

29. An automatic assembly system of claim 28, wherein means for controlling position includes board moving means for moving said board horizontally in response to said detected position of the component without moving said means for holding horizontally.

30. An automatic assembly system of claim 29, further comprising means for imaging at least a portion of said board; said processing means includes means for detecting a position of the board in response to an output of said means of imaging; and said board moving means are responsive to the detected positions of said components and the board.

31. An automatic assembly system of claim 25, wherein: said means for holding is provided above the board; and said means for moving includes means for moving vertically toward the board; and said means for controlling includes rotation control means for controlling said relative angular orientation so as to allow said component to be moved to said predetermined position on the board with a predetermined relative angular orientation to the board when said means for holding is moved vertically to the board by said means for moving.

32. An automatic assembly system of claim 31, wherein said rotation control means includes means for rotating said means for holding around vertical axis by an amount necessary to compensate for an angular rotation of said component from a predetermined orientation, in response to said detected angular orientation of the component.

33. An automatic assembly system of claim 32, further comprising means for imaging at least two portions of said board; said processing means includes means for detecting an angular orientation of the board in response to an output of said means for imaging at least two portions; and wherein said rotation control means further includes means for rotating said board by an amount necessary to compensate for an angular rotation of the board from a predetermined position, in response to said detected angular rotation of the board.

34. An automatic assembly system of claim 23 wherein said component has a flat top portion and said leads each have a part extending in parallel to said flat top and said feeder means functioning for feeding said electrical components to a vacuum suction type holder of components, said feeder means comprising:
- feeder rod means extending horizontally and having plural flat surfaces extending in parallel to an axis of said feeder rod means, each surface having a portion of a specific size for containing an electronic component of a corresponding size,
- means for horizontally moving said feeder rod means between a first position to receive an electronic component in one of the portions of said feeder rod means and a second position located under said means for holding to supply said received electronic component to said means for holding; and
- means for rotating said feeder rod means so as to selectively orient one of said flat surfaces in a horizontal position in response to a size of an electrode component which should be received next by said feeder rod means.

* * * * *